United States Patent
Wang et al.

(10) Patent No.: US 12,293,720 B2
(45) Date of Patent: May 6, 2025

(54) PIXEL CIRCUIT, DRIVING METHOD, DISPLAY SUBSTRATE AND DISPLAY DEVICE

(71) Applicants: Chengdu BOE Optoelectronics Technology Co., Ltd., Sichuan (CN); BOE TECHNOLOGY GROUP CO., LTD., Beijing (CN)

(72) Inventors: Zhu Wang, Beijing (CN); Ling Shi, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/708,302

(22) PCT Filed: Aug. 31, 2023

(86) PCT No.: PCT/CN2023/116151
§ 371 (c)(1),
(2) Date: May 8, 2024

(87) PCT Pub. No.: WO2025/043611
PCT Pub. Date: Mar. 6, 2025

(65) Prior Publication Data
US 2025/0078752 A1 Mar. 6, 2025

(51) Int. Cl.
G09G 3/3233 (2016.01)
H10K 59/121 (2023.01)
H10K 59/131 (2023.01)

(52) U.S. Cl.
CPC ... *G09G 3/3233* (2013.01); *G09G 2300/0819* (2013.01); *G09G 2300/0852* (2013.01);
(Continued)

(58) Field of Classification Search
CPC .................. G09G 3/32–3291; H10K 59/10–95
See application file for complete search history.

(56) References Cited

U.S. PATENT DOCUMENTS

| 11,398,184 | B2 * | 7/2022 | Liu | G09G 3/32 |
| 11,508,320 | B2 * | 11/2022 | Kim | G09G 3/3266 |
| 2024/0324342 | A1 * | 9/2024 | Son | H10K 59/131 |

FOREIGN PATENT DOCUMENTS

| CN | 112382237 A | 2/2021 |
| CN | 113643665 A | 11/2021 |

(Continued)

*Primary Examiner* — Gene W Lee

(57) ABSTRACT

A pixel circuit includes: data writing sub-circuit coupled to data signal terminal, scanning signal terminal and fourth node; first light-emitting control sub-circuit coupled to first voltage terminal, first light-emitting control terminal and second node; driving sub-circuit coupled to first node, the second node and third node; storage sub-circuit coupled to the first node and the fourth node; compensation sub-circuit coupled to compensation signal terminal, the first node and the third node; second light-emitting control sub-circuit coupled to the third node, second light-emitting control terminal, and an electrode of light-emitting element; first initialization sub-circuit coupled to first reset signal terminal, first initialization signal terminal and the fourth node; second initialization sub-circuit coupled to second reset signal terminal, second initialization signal terminal and an electrode of the light-emitting element; third initialization sub-circuit coupled to third reset signal terminal, third initialization signal terminal and the third node.

20 Claims, 20 Drawing Sheets

(52) U.S. Cl.
CPC . *G09G 2300/0861* (2013.01); *G09G 2310/08* (2013.01); *G09G 2320/0233* (2013.01); *G09G 2320/0247* (2013.01); *H10K 59/1213* (2023.02); *H10K 59/1216* (2023.02); *H10K 59/131* (2023.02)

(56) References Cited

FOREIGN PATENT DOCUMENTS

| | | |
|---|---|---|
| CN | 215265531 U | 12/2021 |
| CN | 114530464 A | 5/2022 |
| CN | 115527487 A | 12/2022 |
| CN | 116417465 A | 7/2023 |
| KR | 20120043302 A | 5/2012 |
| KR | 20190100550 A | 8/2019 |

* cited by examiner

PIXEL CIRCUIT, DRIVING METHOD, DISPLAY SUBSTRATE AND DISPLAY DEVICE

CROSS-REFERENCE TO RELATED APPLICATION

This application is a Section 371 National Stage Application of International Application No. PCT/CN2023/116151, filed on Aug. 31, 2023, entitled "PIXEL CIRCUIT, DRIVING METHOD, DISPLAY SUBSTRATE AND DISPLAY DEVICE", the content of which is hereby incorporated by reference in its entirety.

TECHNICAL FIELD

The present disclosure relates to a field of display technology, in particular to a pixel circuit, a driving method, a display substrate and a display device.

BACKGROUND

With a development of display technology, display products have different application requirements such as high-frequency display and large-sized display. However, for high-frequency display products, due to circuit screen writing and compensation time compression, the driving voltage compensation time is insufficient, which affects the display effect. For large-sized display products, due to large driving current, serious voltage drops occur, resulting in insufficient driving voltage and affecting the display effect.

It is one of the important research issues for research and development personnel about how to optimize the pixel circuit of display products and ensure stable driving voltage.

The above information disclosed in this section is only for the purpose of understanding the background of the technical concept of the present disclosure. Therefore, the above information may include information that does not constitute the prior art.

SUMMARY

In an aspect, a pixel circuit is provided, including: a data writing sub-circuit coupled to a data signal terminal, a scanning signal terminal and a fourth node, and configured to write a data signal received at the data signal terminal into the fourth node, in response to a scanning signal received at the scanning signal terminal; a first light-emitting control sub-circuit coupled to a first voltage terminal, a first light-emitting control terminal and a second node, and configured to write a first voltage received at the first voltage terminal into the second node, in response to a first light-emitting control signal received at the first light-emitting control terminal; a driving sub-circuit coupled to a first node, the second node and a third node, and configured to generate a driving current in response to a voltage of the first node; a storage sub-circuit coupled between the first node and the fourth node, and configured to store a voltage; a compensation sub-circuit coupled to a compensation signal terminal, the first node and the third node, and configured to transmit the first voltage from the first voltage terminal and a threshold voltage of the driving sub-circuit to the first node, in response to a compensation control signal received at the compensation signal terminal; a second light-emitting control sub-circuit coupled to the third node, a second light-emitting control terminal and a first electrode of a light-emitting element, and configured to output the driving current transmitted to the third node to the light-emitting element, in response to a second light-emitting control signal received at the second light-emitting control terminal; a first initialization sub-circuit coupled to a first reset signal terminal, a first initialization signal terminal and the fourth node, and configured to transmit a first initialization signal received at the first initialization signal terminal to the fourth node, in response to a first reset signal received at the first reset signal terminal, so as to initialize a potential of the fourth node; a second initialization sub-circuit coupled to a second reset signal terminal, a second initialization signal terminal and the first electrode of the light-emitting element, and configured to transmit a second initialization signal received at the second initialization signal terminal to the first electrode of the light-emitting element, in response to a second reset signal received at the second reset signal terminal, so as to initialize a potential of the first electrode of the light-emitting element; and a third initialization sub-circuit coupled to a third reset signal terminal, a third initialization signal terminal and the third node, and configured to transmit a third initialization signal received at the third initialization signal terminal to the third node, in response to a third reset signal received at the third reset signal terminal, so as to initialize a potential of the third node.

According to some exemplary embodiments, the pixel circuit further includes a potential maintaining sub-circuit. The potential maintaining sub-circuit is coupled between the first voltage terminal and the fourth node. The potential maintaining sub-circuit is configured to maintain a potential of the first node.

According to some exemplary embodiments, the pixel circuit is configured to transmit the first voltage from the first voltage terminal and the threshold voltage of the driving sub-circuit to the first node, in response to the first light-emitting control signal, the first reset signal and the compensation control signal.

According to some exemplary embodiments, the third initialization sub-circuit and the compensation sub-circuit are further configured to transmit the third initialization signal received at the third initialization signal terminal to the first node, in response to the third reset signal received at the third reset signal terminal and in response to a second control signal received at the compensation signal terminal, so as to initialize a potential of the first node.

According to some exemplary embodiments, the second initialization sub-circuit includes a first transistor. A control electrode of the first transistor is coupled to the second reset signal terminal, a first electrode of the first transistor is coupled to the second initialization signal terminal, and a second electrode of the first transistor is coupled to the first electrode of the light-emitting element.

According to some exemplary embodiments, the compensation sub-circuit includes a second transistor. A control electrode of the second transistor is coupled to the compensation signal terminal, a first electrode of the second transistor is coupled to the first node, and a second electrode of the second transistor is coupled to the third node.

According to some exemplary embodiments, the driving sub-circuit includes a third transistor. A control electrode of the third transistor is coupled to the first node, a first electrode of the third transistor is coupled to the second node, and a second electrode of the third transistor is coupled to the third node.

According to some exemplary embodiments, the data writing sub-circuit includes a fourth transistor. A control electrode of the fourth transistor is coupled to the scanning signal terminal, a first electrode of the fourth transistor is coupled to the data signal terminal, and a second electrode of the fourth transistor is coupled to the fourth node.

According to some exemplary embodiments, the first light-emitting control sub-circuit includes a fifth transistor. A control electrode of the fifth transistor is coupled to the first light-emitting control terminal, a first electrode of the fifth transistor is coupled to the first voltage terminal, and a second electrode of the fifth transistor is coupled to the second node.

According to some exemplary embodiments, the second light-emitting control sub-circuit includes a sixth transistor. A control electrode of the sixth transistor is coupled to the second light-emitting control terminal, a first electrode of the sixth transistor is coupled to the third node, and a second electrode of the sixth transistor is coupled to the first electrode of the light-emitting element.

According to some exemplary embodiments, the first initialization sub-circuit includes a seventh transistor. A control electrode of the seventh transistor is coupled to the first reset signal terminal, a first electrode of the seventh transistor is coupled to the first initialization signal terminal, and a second electrode of the seventh transistor is coupled to the fourth node.

According to some exemplary embodiments, the third initialization sub-circuit includes an eighth transistor. A control electrode of the eighth transistor is coupled to the third reset signal terminal, a first electrode of the eighth transistor is coupled to the third initialization signal terminal, and a second electrode of the eighth transistor is coupled to the third node.

According to some exemplary embodiments, the storage sub-circuit includes a first capacitor. A first terminal of the first capacitor is coupled to the first node, and a second terminal of the first capacitor is coupled to the fourth node.

According to some exemplary embodiments, the potential maintaining sub-circuit includes a second capacitor. A first terminal of the second capacitor is coupled to the first voltage terminal, and a second terminal of the second capacitor is coupled to the fourth node.

According to some exemplary embodiments, the second reset signal terminal and the third reset signal terminal are a same reset signal terminal.

In another aspect, a method for driving a pixel circuit is provided, applied to the pixel circuit as described above. The driving method includes: in a compensation stage of an image frame, in which the first light-emitting control sub-circuit writes a first voltage received at the first voltage terminal into the second node, in response to the first light-emitting control signal; and conducting the first initialization sub-circuit and the compensation sub-circuit, in response to the first reset signal and the compensation control signal, so that the first voltage from the first voltage terminal and a threshold voltage of the driving sub-circuit are transmitted to the first node. A time of the compensation stage is adjusted by the first light-emitting control signal, the first reset signal, and the compensation control signal.

According to some exemplary embodiments, the driving method further includes: in a reset stage of an image frame, in which the first initialization sub-circuit transmits a first initialization signal received at the first initialization signal terminal to the fourth node, in response to the first reset signal received at the first reset signal terminal, so as to initialize a potential of the fourth node; and after a preset time interval, in which the third initialization sub-circuit transmits a third initialization signal received at the third initialization signal terminal to the third node, in response to a third reset signal received at the third reset signal terminal, and conducting the compensation sub-circuit, in response to the compensation control signal received at the compensation signal terminal, so that the third initialization signal is transmitted to the first node to initialize a potential of the first node.

In yet another aspect, a display substrate is provided. The display substrate includes: a base substrate; the pixel circuit as described above disposed on the base substrate; and a light-emitting element disposed on the base substrate. The light-emitting element is coupled to the pixel circuit.

In still another aspect, a display substrate is provided. The display substrate includes: a base substrate; a first semiconductor layer disposed on the base substrate; a first conductive layer disposed on a side of the first semiconductor layer away from the base substrate; a second conductive layer disposed on a side of the first conductive layer away from the base substrate; a second semiconductor layer disposed on a side of the second conductive layer away from the base substrate, where the second semiconductor layer includes an oxide semiconductor; a third conductive layer disposed on a side of the second semiconductor layer away from the base substrate; a fourth conductive layer disposed on a side of the third conductive layer away from the base substrate; and a fifth conductive layer disposed on a side of the fourth conductive layer away from the base substrate. The display substrate further includes a pixel circuit disposed on the base substrate. The pixel circuit includes a data writing sub-circuit, a driving sub-circuit, a compensation sub-circuit, a first light-emitting control sub-circuit, a second light-emitting control sub-circuit, a first initialization sub-circuit, a second initialization sub-circuit and a third initialization sub-circuit. The second initialization sub-circuit includes a first transistor. The compensation sub-circuit includes a second transistor. The driving sub-circuit includes a third transistor. The data writing sub-circuit includes a fourth transistor. The first light-emitting control sub-circuit includes a fifth transistor. The second light-emitting control sub-circuit includes a sixth transistor. The first initialization sub-circuit includes a seventh transistor. The third initialization sub-circuit includes an eighth transistor. The display substrate further includes: a second reset signal line, a first light-emitting control line and a second light-emitting control line which are located in the first conductive layer; a third initialization signal line, a first sub-line of a compensation signal line, a first sub-line of a first reset signal line and a first sub-line of a scanning signal line which are located in the second conductive layer; a second initialization signal line, a first initialization signal line, a second sub-line of the compensation signal line, a second sub-line of the first reset signal line and a second sub-line of the scanning signal line which are located in the third conductive layer. An orthographic projection of the first sub-line of the compensation signal line on the base substrate at least partially overlaps with an orthographic projection of the second semiconductor layer on the base substrate. An orthographic projection of the second sub-line of the compensation signal line on the base substrate at least partially overlaps with an orthographic projection of the second semiconductor layer on the base substrate. An overlap between the first sub-line of the compensation signal line and the second semiconductor layer is a first sub control electrode of the second transistor. An overlap between the second sub-line of the compensation signal line and the second semiconductor layer is a second sub control electrode of the second transistor. An orthographic projection of the first sub-line of the scanning signal line on the base substrate at least partially overlaps with an orthographic projection of the second semiconductor layer on the base substrate. An orthographic projection of the second sub-line of the scanning signal line on the base substrate at least partially overlaps with an orthographic projection of the second semiconductor layer on the base substrate. An overlap between the first sub-line of the scanning signal line and the second semiconductor layer is a first sub control electrode of the fourth transistor. An overlap between the second sub-line of the scanning signal line and the second semiconductor layer is a second sub control electrode of the fourth transistor. An orthographic projection of the first sub-line of the first reset signal line on the base substrate at least partially overlaps with an orthographic projection of the second semiconductor layer on the base substrate. An orthographic projection of the second sub-line of the first reset signal line on the base substrate at least partially overlaps with an orthographic projection of the second semiconductor layer on the base substrate. An overlap between the first sub-line of the first reset signal line and the second semiconductor layer is a first sub control electrode of the seventh transistor. An overlap between the second sub-line of the first reset signal line and the second semiconductor layer is a second sub control electrode of the seventh transistor.

According to some exemplary embodiments, the display substrate further includes a plurality of connecting signal lines located in the fourth conductive layer. At least one of the first initialization signal line, the second initialization signal line and the third initialization signal line extends along a first direction. The plurality of connecting signal lines extend along a second direction, respectively. At least one of the first initialization signal line, the second initialization signal line and the third initialization signal line is electrically connected to the plurality of connecting signal lines to form a mesh structure.

According to some exemplary embodiments, the pixel circuit further includes a storage sub-circuit and a potential maintaining sub-circuit. The storage sub-circuit includes a first capacitor. The potential maintaining sub-circuit includes a second capacitor. The display substrate further includes a first conductive portion located in the first conductive layer, a second conductive portion located in the second conductive layer, a third conductive portion located in the fourth conductive layer, and a first voltage signal line located in the fifth conductive layer. The first voltage signal line includes a widened portion. The first conductive portion is a first terminal of the first capacitor. The second conductive portion and the third conductive portion electrically connected to each other are a second terminal of the first capacitor and a second terminal of the second capacitor. The widened portion of the first voltage signal line is a first terminal of the second capacitor. An orthographic projection of the widened portion of the first voltage signal line on the base substrate covers an orthographic projection of each of the first conductive portion, the second conductive portion and the third conductive portion on the base substrate.

In further another aspect, a display device is provided, including the display substrate as described above.

BRIEF DESCRIPTION OF DRAWINGS

Through the description of exemplary embodiments of the present disclosure in detail with reference to the accompanying drawings, the features and advantages of the present disclosure will become more apparent.

DETAILED DESCRIPTION

Figure 1:
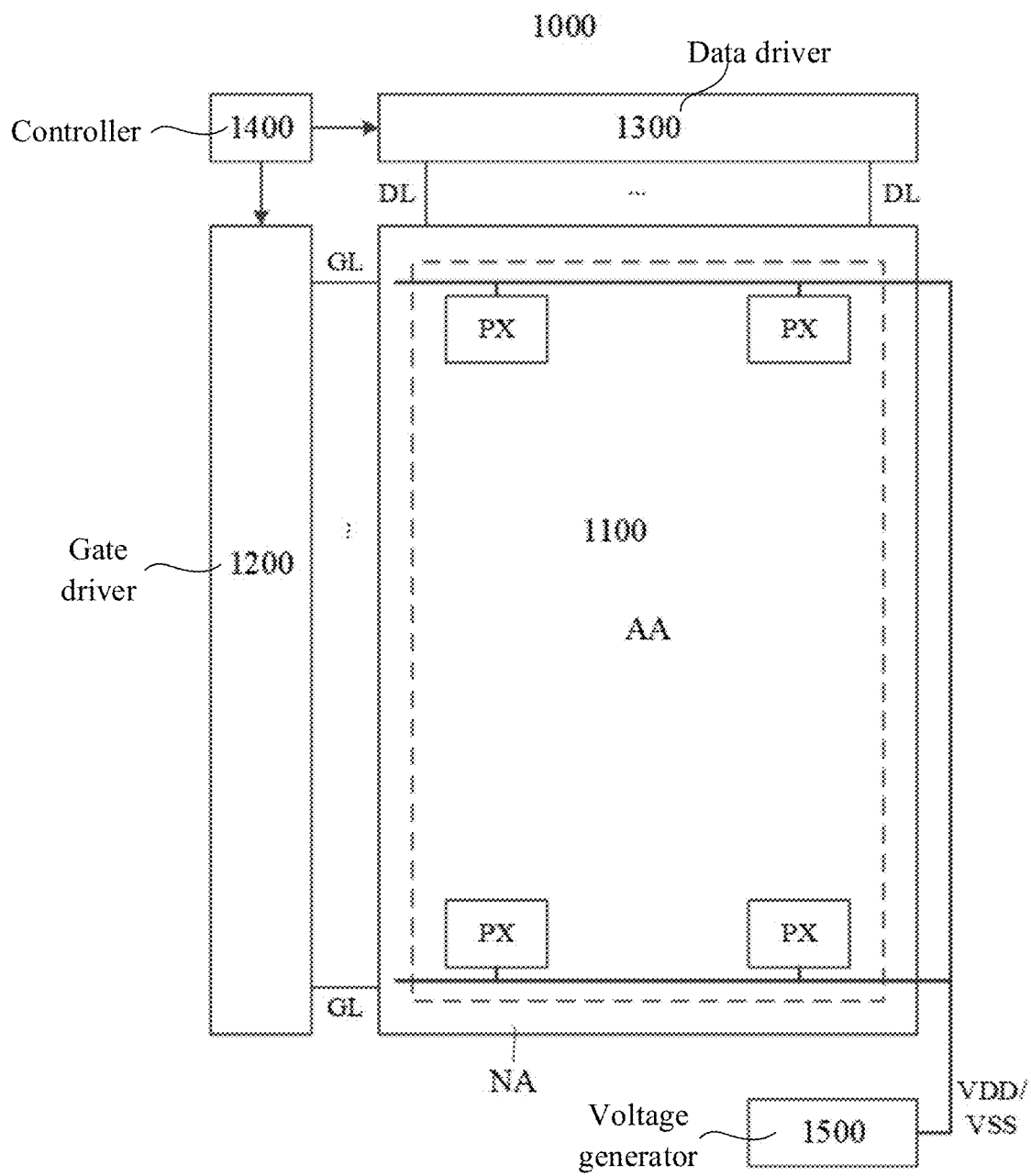
FIG. 1 is a schematic plan view of a display device according to some embodiments of the present disclosure.

In order to make purposes, technical solutions, and advantages of embodiments of the present disclosure clearer, technical solutions in some embodiments of the present disclosure will be described clearly and completely in combination with accompanying drawings. Obviously, the described embodiments are only part of the embodiments of the present disclosure, not all of them. Based on the embodiments of the present disclosure provided, all other embodiments obtained by those of ordinary skilled in the art without creative labor, fall within scope of protection of the present disclosure.

It should be noted that, in the drawings, a size and a relative size of the elements may be exaggerated for clarity and/or description. In this way, a dimension and a relative dimension of the various elements are not necessarily limited to those shown in the drawings. In the specification and drawings, a same or similar reference number refer to a same or similar part.

When an element is described as being "on", "connected to", or "coupled to" another element, the element may be directly on, directly connected to, or directly coupled to the other element, or intermediate elements may be existed. However, when an element is described as being "directly on", "directly connected to", or "directly coupled to" another element, there is no intermediate element existed. Other terms and/or expressions used to describe a relationship between elements should be interpreted in a similar fashion, e.g., "between" versus "directly between", "adjacent" versus "directly adjacent", or "on" versus "directly on" etc. Furthermore, the term "connected" may refer to a physical connection, an electrical connection, a communication connection, and/or a fluid connection. In addition, an X axis, a Y axis and a Z axis are not limited to a three axes of a rectangular coordinate system, and may be interpreted in a broader sense. For example, the X, Y, and Z axes may be perpendicular to each other, or may represent different directions that are not perpendicular to each other. For a purpose of the present disclosure, "at least one of X, Y, and Z" and "at least one of the selected groups consisted of X, Y, and Z" may be interpreted as X only, Y only, Z only, or such as any combination of two or more of X, Y and Z in XYZ, XYY, YZ and ZZ. As used herein, the term "and/or" includes any and all combinations of one or more of the associated listed items.

It should be noted that, although the terms "first", "second", etc. may be used herein to describe various components, members, elements, regions, layers and/or parts, these components, members, elements, regions, layers and/or parts will not be limited by these terms. Rather, these terms are used to distinguish one component, member, element, region, layer and/or part from another. Thus, for example, a first component, a first member, a first element, a first region, a first layer and/or a first part discussed below could be termed a second component, a second member, a second element, a second region, a second layer and/or a second part without departing from the teachings of the present disclosure.

For ease of description, a spatially relational term, e.g., "upper", "lower", "left", "right", etc. may be used herein to describe a relationship between one element or feature with another element or feature as shown in the drawings. It should be understood that the spatially relational term are intended to encompass other different orientations of the apparatus in use or operation in addition to an orientation depicted in the drawings. For example, if the apparatus in the drawings is turned over, the elements described as "below" or "beneath" the other elements or features would then be oriented "above" or "on" the other elements or features.

In this text, the terms "basically", "about", "approximately", "roughly" and other similar terms are used as approximate terms rather than as terms of degree, and they are intended to explain the fixed deviation of measured or calculated values that will be recognized by those skilled in the art. Taking into account factors such as process fluctuations, measurement problems and errors related to the measurement of a specific amount (i.e., the limitations of the measurement system), the "about" or "approximately" used here includes the stated value, and indicates that the specific value determined by ordinary technicians in the art is within the acceptable deviation range. For example, "about" may be expressed within one or more standard deviations, or within ±30%, ±20%, ±10%, ±5% of the stated values.

It should be noted that the expression "same layer" refers to a layer structure which is formed by forming a layer used to form a specific pattern by the same film-forming process, and then patterning the layer by using the same mask through an one-time patterning process. According to the difference between the specific patterns, the one-time patterning process may include multiple exposures, developments or etching processes, and the specific pattern in the formed layer structure may be continuous or discontinuous. That is, multiple elements, components, structures and/or parts located in the "same layer" are made of the same material and formed by the same composition process. Generally, multiple elements, components, structures and/or parts located in the "same layer" have substantially the same thicknesses.

Those of skill in the art should understand that in this text, unless otherwise specified, the term "height" or "thickness" refers to the dimensions along the surface of each film layer disposed perpendicular to the display substrate, that is, the dimensions along a direction of light output of the display substrate, or the dimensions along a normal direction of the display device.

In this text, the term "transistor" may refer to a triode, a thin-film transistor, a field-effect transistor or other devices with similar characteristics. In the embodiments of the present disclosure, in order to distinguish between the two electrodes of the transistor except for the control electrode, one electrode is referred to as a first electrode and the other electrode is referred to as a second electrode. In practical operation, when the transistor is a thin film transistor or a field-effect transistor, the first electrode may be a drain, and the second electrode may be a source. Alternatively, the first electrode may be a source, and the second electrode may be a drain.

The embodiments of the present disclosure provide at least one pixel circuit. The pixel circuit includes a data writing sub-circuit, where the data writing sub-circuit is coupled with a data signal terminal, a scanning signal terminal and a fourth node, and the data writing sub-circuit is configured to write a data signal received at the data signal terminal into the fourth node, in response to a scanning signal received at the scanning signal terminal; a first light-emitting control sub-circuit, where the first light-emitting control sub-circuit is coupled to a first voltage terminal, a first light-emitting control terminal and a second node, and the first light-emitting control sub-circuit is configured to write a first voltage received at the first voltage terminal into the second node, in response to a first light-emitting control signal received at the first light-emitting control terminal; a driving sub-circuit, where the driving sub-circuit is coupled to a first node, the second node and a third node, and the driving sub-circuit is configured to generate a driving current in response to a voltage of the first node; a storage sub-circuit, where the storage sub-circuit is coupled between the first node and the fourth node, and the storage sub-circuit is configured to store a voltage; a compensation sub-circuit, where the compensation sub-circuit is coupled to a compensation signal terminal, the first node and the third node, and the compensation sub-circuit is configured to transmit the first voltage from the first voltage terminal and a threshold voltage of the driving sub-circuit to the first node, in response to a compensation control signal received at the compensation signal terminal; a second light-emitting control sub-circuit, where the second light-emitting control sub-circuit is coupled to the third node, a second light-emitting control terminal and a first electrode of a light-emitting element, and the second light-emitting control sub-circuit is configured to output the driving current transmitted to the third node to the light-emitting element, in response to a second light-emitting control signal received at the second light-emitting control terminal; a first initialization sub-circuit, where the first initialization sub-circuit is coupled to a first reset signal terminal, a first initialization signal terminal and the fourth node, and the first initialization sub-circuit is configured to transmit a first initialization signal received at the first initialization signal terminal to the fourth node, in response to a first reset signal received at the first reset signal terminal, so as to initialize a potential of the fourth node; a second initialization sub-circuit, where the second initialization sub-circuit is coupled to a second reset signal terminal, a second initialization signal terminal and the first electrode of the light-emitting element, and the second initialization sub-circuit is configured to transmit a second initialization signal received at the second initialization signal terminal to the first electrode of the light-emitting element, in response to a second reset signal received at the second reset signal terminal, so as to initialize a potential of the first electrode of the light-emitting element; and, a third initialization sub-circuit, where the third initialization sub-circuit is coupled to a third reset signal terminal, a third initialization signal terminal and the third node, and the third initialization sub-circuit is configured to transmit a third initialization signal received at the third initialization signal terminal to the third node, in response to a third reset signal received at the third reset signal terminal, so as to initialize a potential of the third node. By controlling the turn-on or turn-off status and respective turn-on or turn-off times of the first light-emitting control sub-circuit, the first initialization sub-circuit and the compensation sub-circuit, the writing time of the first voltage received at the first voltage terminal may be flexibly adjusted to fully compensate for the voltage of the first node coupled to the control terminal of the driving sub-circuit, so that it ensures that the light-emitting element obtains a stable driving voltage, thereby improving the display effect of the display product.

FIG. 1 is a schematic plan view of a display device according to some embodiments of the present disclosure. For example, the display device may be an OLED display device. With reference to FIG. 1, the display device may include a display panel 1000, a gate driver 1200, a data driver 1300, a controller 1400 and a voltage generator 1500. The display panel 1000 may include a display substrate 1100 and a plurality of pixels PX. An array substrate 1000 may include a display region AA and a non-display region NA. The plurality of pixels PX are arranged in an array in the display region AA. A signal generated by the gate driver 1200 may be applied to the pixel PX through a signal line, such as a scanning signal line GL. A signal generated by the data driver 1300 may be applied to the pixel PX through a signal line, such as a data line DL. For example, a first voltage of VDD and a second voltage of VSS may be applied to the pixel PX. For example, the first voltage of VDD may be higher than the second voltage of VSS. Optionally, for example, the first voltage of VDD may be applied to an anode of the light-emitting element (such as OLED), and the second voltage of VSS may be applied to a cathode of the light-emitting element, so that the light-emitting element may emit light.

For example, each pixel PX may include a plurality of sub-pixels, such as red sub-pixels, green sub-pixels and blue sub-pixels, or may include white sub-pixels, red sub-pixels, green sub-pixels and blue sub-pixels.

Figure 2:
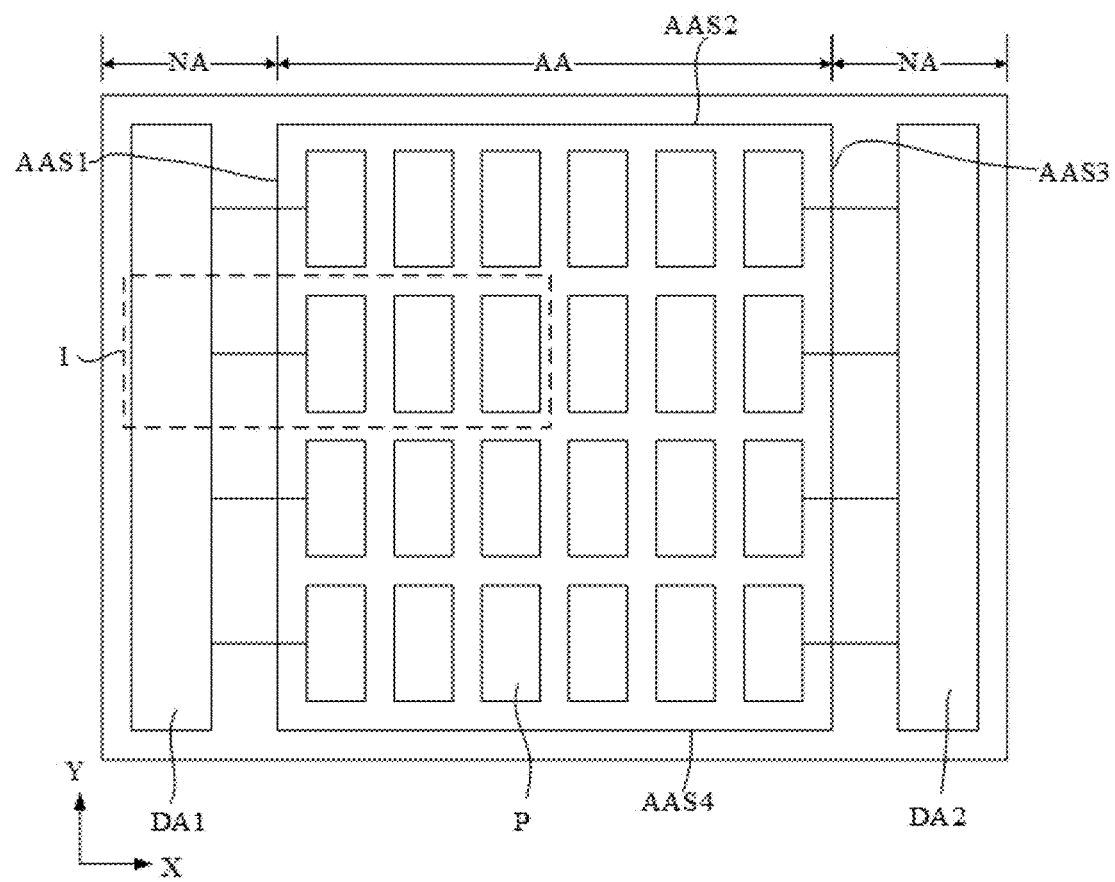
FIG. 2 is a schematic plan view of a display substrate included in a display device according to some embodiments of the present disclosure.

FIG. 2 is a schematic plan view of a display substrate included in a display device according to some embodiments of the present disclosure. For example, the display substrate may be an array substrate used as an OLED display panel.

With reference to FIG. 2, the display substrate may include a display region AA and a non-display region NA. For example, the display region AA and the non-display region NA may include a plurality of boundaries, such as AAS1, AAS2, AAS3 and AAS4 as shown in FIG. 2. The display substrate may also include a driver located in the non-display region NA. For example, the driver may be located on at least a side of the display region AA. In the embodiment shown in FIG. 2, the driver is located on the left and right sides of the display region AA, respectively. It should be noted that the left and right sides may refer to the left and right sides of the display substrate (screen) viewed by the human eye during display. The driver may be used to drive various pixels in the display substrate for display. For example, the driver may include the gate driver 1200 and the data driver 1300 mentioned above. The data driver 1300 is used to sequentially lock input data based on a clock signal timely, convert the locked data into analog signals, and input them onto various data lines of the display substrate. The gate driver 1200 is usually implemented by a shift register. The shift register converts the clock signal into a turn-on/turn-off voltage and outputs it to each scanning signal line of the display substrate.

It should be noted that although FIG. 2 shows that the driver is located on the left and right sides of the display region AA. However, the embodiments of the present disclosure are not limited to this. The driving circuit may be located at any suitable position in the non-display region NA.

For example, the driver may adopt GOA technology, that is, Gate Driver on Array. In GOA technology, the gate driving circuit is directly disposed on the array substrate to replace an external driving chip. Each GOA unit serves as one stage shift register. Each stage shift register is connected to one gate line. The turn-on voltage is sequentially output through each stage shift register, the pixels are scanned row by row. In some embodiments, each stage shift register may also be connected to a plurality of gate lines. In this way, it may adapt to a development trend of high resolution and narrow borders of the display substrate.

With reference to FIG. 2, on the display substrate, a left GOA circuit DA1, a plurality of sub-pixels P located in the display region AA, and a right GOA circuit DA2 are provided. The left GOA circuit DA1 and the right GOA circuit DA2 are respectively electrically connected to a display IC through signal lines. The supply of GOA signals is controlled by the display IC. For example, the display IC is disposed on a lower side of the display substrate (in a direction of human eye view). The left GOA circuit DA1 and the right GOA circuit DA2 are also electrically connected to each pixel through signal lines (such as a scanning signal line GL), so as to supply driving signals to each pixel.

It should be noted that the exemplary figure illustrates that a shape of an orthographic projection of a sub-pixel on the base substrate is a rounded rectangle. However, the embodiments of the present disclosure are not limited to this. For example, the shape of the orthographic projection of the sub-pixel on the base substrate may be other shapes such as a rectangle, a hexagon, a pentagon, a square, a circle, etc. Moreover, the arrangement of three sub-pixels in a pixel unit is not limited to the methods shown in FIGS. 1 and 2.

With reference to FIGS. 1 and 2, each pixel unit may include a plurality of sub-pixels P, such as a first sub-pixel, a second sub-pixel and a third sub-pixel. For the convenience of understanding, the first sub-pixel, the second sub-pixel and the third sub-pixel may be described as red sub-pixel, green sub-pixel and blue sub-pixel, respectively. However, the embodiments of the present disclosure are not limited to this.

The plurality of sub-pixels are arranged in an array along a row direction X and a column direction Y on the base substrate 1. It should be noted that although in the illustrated embodiment, the row direction X and the column direction Y are perpendicular to each other. However, the embodiments of the present disclosure are not limited to this.

It should be understood that in the embodiments of the present disclosure, each sub-pixel includes a pixel circuit and a light-emitting element. For example, the light-emitting element may be an OLED light-emitting element, including an anode, a light-emitting layer and a cathode which are stacked. The pixel circuit may include a plurality of thin film transistors and at least one storage capacitor.

Figure 3:
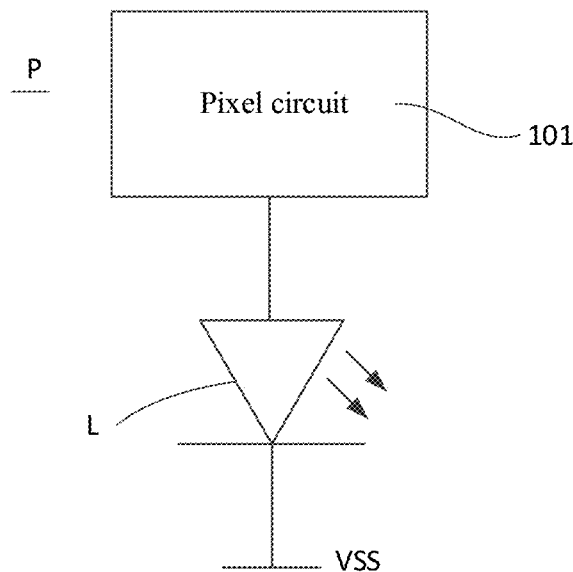
FIG. 3 is a schematic diagram of a structure of a sub-pixel according to some embodiments of the present disclosure.

FIG. 3 is a schematic diagram of a structure of a sub-pixel according to some embodiments of the present disclosure.

As shown in FIG. 3, each sub-pixel P includes a light-emitting element L and a pixel circuit 101 coupled to the light-emitting element L. The pixel circuit 101 is configured to provide a driving current to the light-emitting element L to drive the light-emitting element L to work (i.e. emit light).

For example, with continued reference to FIG. 3, a first electrode of the light-emitting element L is coupled to the pixel circuit 101, a second electrode of the light-emitting element L is coupled to a second voltage terminal VSS. The second voltage terminal VSS is configured to transmit the second voltage. The second voltage may be a reference voltage of direct current. For example, the second voltage Vss is −3V. Alternatively, the second voltage Vss is 0V, that is, the second voltage terminal VSS is grounded. The second voltage terminal VSS provides 0V or negative voltage to the second electrode of the light-emitting element L.

For example, the light-emitting element L includes a current driving element. Further, the light-emitting element L may be a current light-emitting diode, such as micro light-emitting diode (Micro LED), mini light-emitting diode (mini LED), quantum light-emitting diode (mini LED), or organic light-emitting diode (OLED). For example, the first electrode of the light-emitting element L and the second electrode of the light-emitting element L are an anode of the light-emitting diode and a cathode of the light-emitting diode, respectively.

Figure 4:
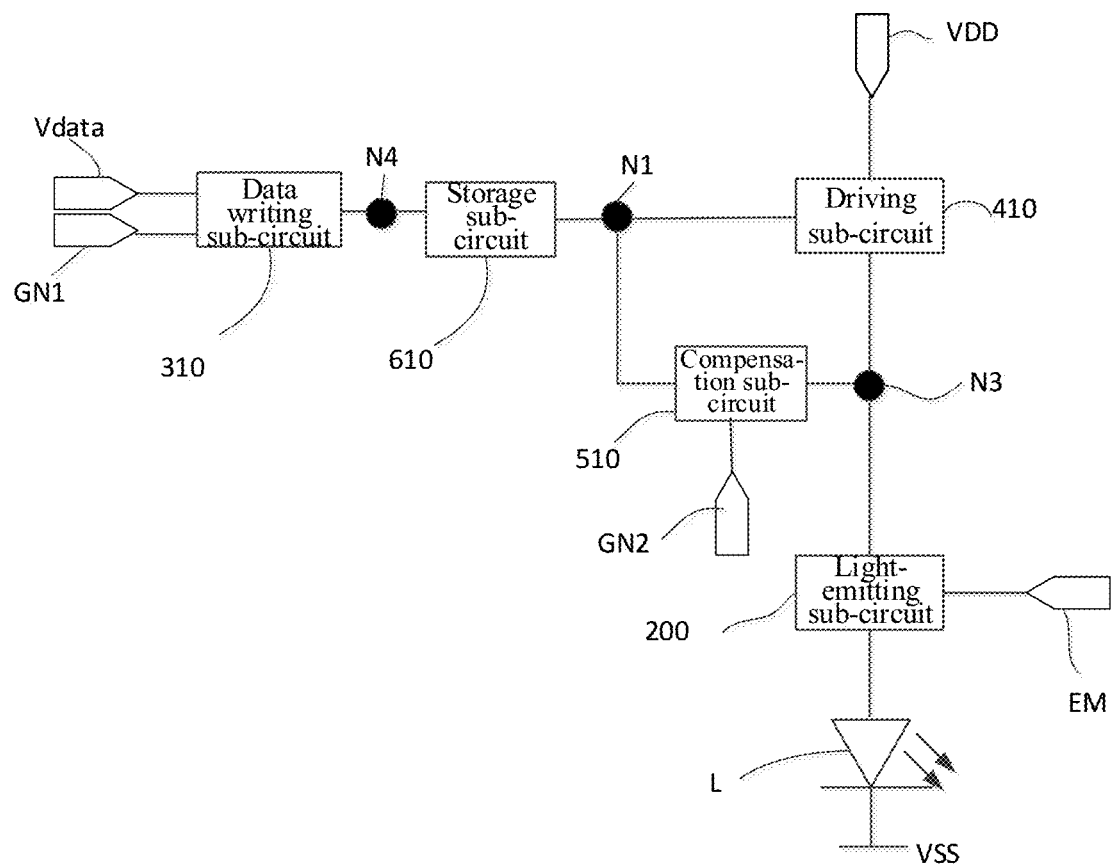
FIG. 4 is a block diagram of a structure of a pixel circuit according to some embodiments of the present disclosure.

FIG. 4 is a block diagram of a structure of a pixel circuit according to some embodiments of the present disclosure. As shown in FIG. 4, the pixel circuit includes a light-emitting control sub-circuit 200, a data writing sub-circuit 310, a driving sub-circuit 410, a compensation sub-circuit 510, and a storage sub-circuit 610.

The data writing sub-circuit 530 is coupled to a data signal terminal Vdata, a scanning signal terminal GN1 and a fourth node N4. The data writing sub-circuit 530 is configured to write a data signal received at the data signal terminal Vdata to the fourth node N4, in response to a scanning signal received at the scanning signal terminal GN1.

The driving sub-circuit 410 is coupled to a first voltage terminal VDD, a first node N1 and a third node N3. The driving sub-circuit 410 is configured to generate a driving current I in response to a voltage of the first node N1.

The storage sub-circuit 610 is coupled between the first node N1 and the fourth node N4. The storage sub-circuit 610 is configured to store a voltage.

The compensation sub-circuit 510 is coupled to a compensation signal terminal GN2, the first node N1 and a third node N3. The compensation sub-circuit 510 is configured to transmit a first voltage Vdd from the first voltage terminal VDD and a threshold voltage Vth of the driving sub-circuit 410 to the first node N1, in response to a control signal received at the compensation signal terminal GN2.

The light-emitting control sub-circuit 200 is coupled to a light-emitting control terminal EM, the third node N3 and the first electrode of the light-emitting element L. The light-emitting control sub-circuit 200 is configured to transmit the driving current I transmitted to the third node N3 to the light-emitting element L, in response to a control signal received at the light-emitting control terminal EM.

The second electrode of the light-emitting element L is coupled to the second voltage terminal VSS.

It should be understood that, in the pixel circuit 101 provided in the embodiments of the present disclosure, nodes such as the first node N1, the second node N2, the third node N3 and the fourth node N4 do not necessarily represent actual components. In some embodiments, these nodes represent the convergence points of relevant couplings (i.e. electrical connections) in the equivalent circuit diagram of the pixel circuit. That is to say, these nodes are nodes formed by being equivalent to the convergence points of relevant electrical connections in the circuit diagram.

For example, the light-emitting element L is an OLED, and a threshold voltage of the light-emitting element L is a threshold voltage $V_{oled-th}$ of the OLED.

Taking the light-emitting element L as an OLED as an example, a working process of the pixel circuit 101 mentioned above will be described. It should be understood that the light-emitting element may also be other current driving elements such as Micro LED, Mini LED or QLED. The embodiments of the present disclosure are not limited to this.

In a compensation stage of an image frame F, the compensation sub-circuit 510 transmits the first voltage (such as power supply voltage Vdd) from the first voltage terminal VDD and the threshold voltage Vth of the driving sub-circuit 410 to the first node N1, in response to the control signal received at the compensation signal terminal GN2. Therefore, the voltage $V_{N1}$ of the first node N1 is equal to Vdd+Vth. For example, the first voltage Vdd from the first voltage terminal VDD is the voltage of direct current, for example, a direct current high level voltage. For example, the first voltage Vdd is 5V.

In a writing stage of the image frame F, the data writing sub-circuit 310 writes the data signal $V_{data}$ received at the data signal terminal $V_{data}$ to the fourth node N4, in response to the scanning signal received at the scanning signal terminal GN1, so that the voltage $V_{N4}$ of the fourth node N4 directly changes to $V_{data}$, that is, $V_{N4}=V_{data}$.

Since the storage sub-circuit 610 relies on its own capacitor to store the voltage, a bootstrap effect (i.e. an effect that the voltage at two terminals of the capacitor may not suddenly change, and when the voltage of one terminal increases, the voltage of the other one terminal still maintains a voltage difference between this terminal and the previous one terminal) of the capacitor is used. After the voltage $V_{N4}$ of the fourth node N4 changes to $V_{data}$, the voltage $V_{N1}$ of the first node N1 will finally stabilize at $V_{N1}=V_{data}+Vdd+Vth$.

Since the voltage difference ($V_{data}+Vth$) between the first voltage terminal VDD and the first node N1 is greater than the threshold voltage Vth of the driving sub-circuit 410, the driving sub-circuit 410 conducts in response to the voltage $V_{N1}$ of the first node N1 and generates a driving current I. The driving circuit satisfies the following equation:

$$I = 1/2 \cdot K \cdot (Vgs - Vth)^2 = 1/2 \cdot K \cdot (V_{N1} - Vdd - Vth)^2 = 1/2 \cdot K \cdot V_{data}^2$$

where K is a fixed constant related to process parameters and geometric dimensions of the driving sub-circuit 410. Vgs is a gate source voltage difference of a driving transistor in the driving sub-circuit 410.

In a light-emitting stage of the image frame F, the light-emitting control sub-circuit 200 outputs the driving current I transmitted to the third node N3 to the light-emitting element L, in response to the control signal received at the light-emitting control terminal EM, so as to drive the light-emitting element L to emit lights.

Since the driving current I finally flowing through the light-emitting element L is not related to the first voltage Vdd and the threshold voltage Vth of the driving sub-circuit 410, the driving current I of the light-emitting element L is not affected by a voltage drop of a first power supply line transmitting the first voltage Vdd and the threshold voltage Vth of the driving sub-circuit 410. In this way, the above-mentioned pixel circuit 101 may improve the uniformity of the driving current flowing through the light-emitting element L, and achieve the uniformity of light-emitting brightness.

Figure 5:
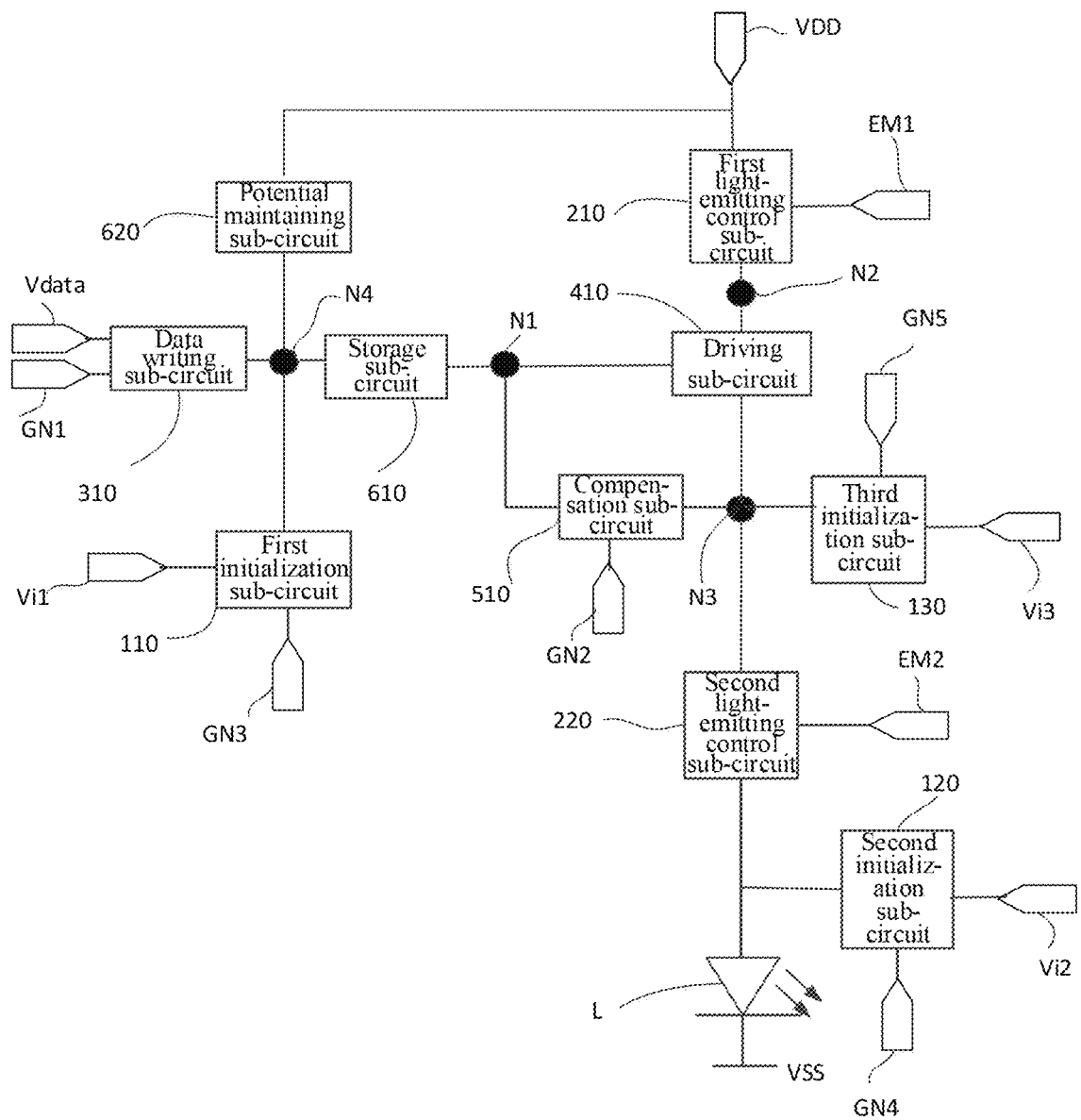
FIG. 5 is a block diagram of a structure of a pixel circuit according to some other embodiments of the present disclosure.
Figure 6:
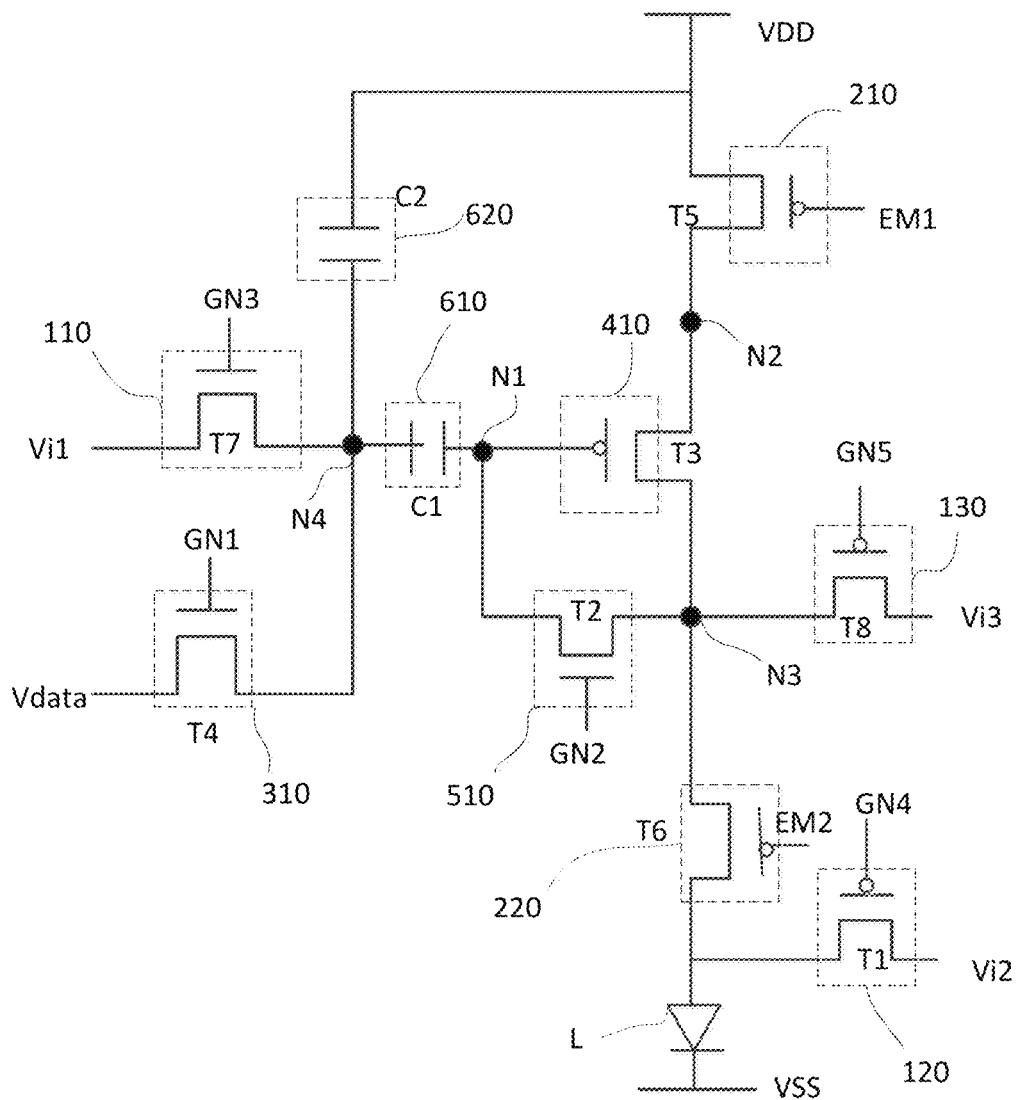
FIG. 6 is an equivalent circuit diagram of a pixel circuit according to some embodiments of the present disclosure.

FIG. 5 is a block diagram of a structure of a pixel circuit according to some other embodiments of the present disclosure. FIG. 6 is an equivalent circuit diagram of a pixel circuit according to some embodiments of the present disclosure. It should be noted that in the following explanation, the structure of the pixel circuit is described in detail by taking an 8T2C pixel circuit as an example. However, the embodiments of the present disclosure are not limited to the 8T2C pixel circuit. Without conflict, other known pixel circuit structures may be applied to the embodiments of the present disclosure.

As shown in FIG. 5, the pixel circuit includes: a first light-emitting control sub-circuit 210, a second light-emitting control circuit 220, a data writing sub-circuit 310, a driving sub-circuit 410, a compensation sub-circuit 510, a storage sub-circuit 610, a potential maintaining sub-circuit 620, and at least one of a first initialization sub-circuit 110, a second initialization sub-circuit 120 and a third initialization sub-circuit 130.

For example, with reference to FIG. 5, according to the pixel circuit of the embodiments of the present disclosure to drive the light-emitting element L. The pixel circuit includes the first initialization sub-circuit 110, which is used to perform a voltage reset for the fourth node N4 in a reset stage. The first initialization sub-circuit 110 is electrically connected to a first initialization signal terminal Vi1, a first reset signal terminal GN3 and the fourth node N4, respectively. The first initialization sub-circuit 110 is used to control a connection between the first initialization signal terminal Vi1 and the fourth node N4 under a control of a first reset signal provided by the first reset signal terminal GN3, so as to reset the voltage of the fourth node N4, clear the data voltage $V_{data}$ of the fourth node N4 in the previous one image frame, and avoid signal interference. According to the actual situation, the first initialization signal provided by the first initialization signal terminal may be selected, which will not be limited herein. For example, a third initialization signal is a low level signal. For example, the third initialization signal is −3V.

The pixel circuit further includes the second initialization sub-circuit 120, which is used to perform a voltage reset for a first electrode of the light-emitting element L in the reset phase. The second initialization sub-circuit 120 is electrically connected to a second reset signal terminal GN4, a second initialization signal terminal Vi2 and the first electrode of the light-emitting element L. The second initialization sub-circuit 120 is used to control a connection between the second initialization signal terminal Vi2 and the first electrode of the light-emitting element L under a control of a reset signal provided by the second reset signal terminal GN4, thereby initializing a potential of the first electrode of the light-emitting element L, that is, the potential of the first electrode of the light-emitting element L will be lowered.

In the reset stage, a voltage of the first electrode of the light-emitting element L is cleared by the second initialization sub-circuit 120, so that the potential of the first electrode of the light-emitting element L is initialized, thereby avoiding the light-emitting element L from emitting light in a dark state due to a leakage current of the second light-emitting control circuit 220, and improving the display quality of the display device provided with this pixel circuit.

The pixel circuit further includes a third initialization sub-circuit 130 and a compensation sub-circuit 510, which may be used to perform a voltage reset for the third node N3 and the first node N1 in the reset phase. The compensation sub-circuit 510 is electrically connected to the compensation signal terminal GN2, the first node N1, and the third node N3, respectively. The compensation sub-circuit 510 is used to control a connection between the first node N1 and the third node N3 under a control of a compensation signal provided by the compensation signal terminal GN2. The third initialization sub-circuit 130 is electrically connected to a third reset signal terminal GN5, a third initialization signal terminal Vi3 and the third node N3. The third initialization sub-circuit 130 is used to control a connection between the third initialization signal terminal Vi3 and the third node N3, under a control of a third reset signal provided by the third reset signal terminal, so as to reset the voltage of the third node N3. Since the first node N1 is connected to the third node N3 at this time, the voltage of the first node N1 is reset, that is, a potential of the first node is lowered.

With continued reference to FIG. 5, the pixel circuit further includes a first light-emitting control sub-circuit 210, which is used to perform a voltage compensation of the first node N1 in a compensation phase. The first light-emitting control sub-circuit 210 is electrically connected to the first voltage terminal VDD, a first light-emitting control terminal EM1, and the second node N2, respectively. The first light-emitting control sub-circuit 210 is used to control a connection between the first voltage terminal VDD and the second node N2 under a control of a first light-emitting control signal provided by the first light-emitting control terminal EM1, so as to write a first voltage Vdd provided by the first voltage terminal VDD into the second node N2, where $V_{N2}$=Vdd. At this stage, the compensation sub-circuit 510 controls a connection between the first node N1 and the third node N3, in response to a compensation control signal received at the compensation signal terminal GN2, so as to transmit the voltage Vdd of the second node N2 and a threshold voltage Vth of the driving sub-circuit 410 to the first node N1. Therefore, the voltage $V_{N1}$ of the first node N1 is equal to Vdd+Vth. For example, the first voltage Vdd from the first voltage terminal VDD is the direct current voltage, for example, the direct current high level voltage. For example, the first voltage Vdd is 5V.

The pixel circuit may transmit the first voltage from the first voltage terminal and the threshold voltage of the driving sub-circuit to the first node, in response to the first light-emitting control signal, the first reset signal and the compensation control signal. By adjusting an turn-on or turn-off time of the first light-emitting control sub-circuit 210, the compensation sub-circuit 510 and the first initialization sub-circuit 110, a voltage compensation time of the compensation stage may be flexibly adjusted, so as to ensure sufficient voltage compensation for the first node N1 and improve a driving effect of the pixel circuit on the light-emitting element L.

In FIG. 5, the node labeled N1 is the first node electrically connected to a control terminal of the driving sub-circuit 410. The node labeled N2 is the second node electrically connected to a first terminal of the driving sub-circuit 410. The node labeled N3 is the third node electrically connected to a second terminal of the driving sub-circuit 410.

With continued reference to FIG. 5, the pixel circuit further includes a data writing sub-circuit 310, which is used to write a data signal provided by the data signal terminal Vdata into the fourth node N4 in a data writing stage. Before the data writing phase begins, the compensation sub-circuit 510 controls the disconnection between the first node N1 and the third node N3 in response to the control signal received at the compensation signal terminal GN2. The first initialization sub-circuit 110 controls a disconnection between the first initialization signal terminal Vi1 and the fourth node N4, in response to a first reset signal received at the first reset signal terminal GN3. The data writing sub-circuit 310 is electrically connected to the data signal terminal Vdata, the scanning signal terminal GN1 and the fourth node N4, respectively. In a data writing stage, under a control of a scanning signal provided by the scanning signal terminal GN1, the data signal terminal Vdata is controlled to be connected to the fourth node N4, thereby writing the data signal Vdata provided by the data signal terminal Vdata into the fourth node N4.

With reference to FIG. 5 and FIG. 6, the pixel circuit further includes a storage sub-circuit 610 and a potential maintaining sub-circuit 620. The potential maintaining sub-circuit 620 is configured to maintain the potential of the first node N1. The storage sub-circuit 610 may include a first capacitor C1. The first capacitor C1 may include a first electrode plate C1a and a second electrode plate C1b. The potential maintaining sub-circuit 620 may include a second capacitor C2. The second capacitor C2 may include a first electrode plate C2a and a second electrode plate C2b. The first electrode plate C1a of the first capacitor C1 is electrically connected to the first node N1, and the second electrode plate C1b of the first capacitor C1 is electrically connected to the fourth node N4. The first electrode plate C2a of the second capacitor C2 is electrically connected to the fourth node N4, and the second electrode plate C2b of the second capacitor C2 is electrically connected to the first voltage terminal VDD. In response to the voltage change of the fourth node N4 electrically connected to the second electrode plate C1b of the first capacitor C1, at this time the capacitance change of the first capacitor C1 is: $\Delta V_{N4}=V_{data}+V_{i1}$.

Since the storage sub-circuit 610 relies on its own capacitor to store the voltage, a bootstrap effect (i.e. an effect that an voltage at two terminals of the capacitor may not suddenly change, and when the voltage of one terminal increases, the voltage of the other one terminal still maintains the voltage difference with this terminal and the previous one terminal) of the capacitor is used. When the voltage change $\Delta V_{N4}$ of the fourth node N4 is $V_{data}+V_{i1}$, the voltage $V_{N1}$ of the first node N1 will finally stabilize at $V_{N1}=V_{data}+V_{i1}+Vdd+Vth$.

Since the voltage difference ($V_{data}+V_{i1}+Vth$) between the first voltage terminal VDD and the first node N1 is greater than the threshold voltage Vth of the driving sub-circuit 410, the driving sub-circuit 410 conducts in response to the voltage $V_{N1}$ of the first node N1 and generates a driving current I. The driving circuit satisfies the following equation:

$$I = 1/2 \cdot K \cdot (Vgs - Vth)^2 = 1/2 \cdot K \cdot (V_{N1} - Vdd - Vth)^2 = 1/2 \cdot K \cdot (V_{data} + V_{i1})^2$$

where K is a fixed constant related to the process parameters and geometric dimensions of the driving sub-circuit 410. Vgs is a gate source voltage difference of the driving transistor in the driving sub-circuit 410.

With continued reference to FIG. 5, the pixel circuit further includes a second light light-emitting control sub-circuit 220, which is used in the light-emitting stage of the image frame. The second light light-emitting control sub-circuit 220 outputs the driving current I transmitted to the third node N3 to the light-emitting element L, in response to a light-emitting control signal received at the second light-emitting control terminal EM2, so as to drive the light-emitting element L to emit light.

Since the driving current I finally flowing through the light-emitting element L is not related to the first voltage Vdd and the threshold voltage Vth of the driving sub-circuit 410, the driving current I of the light-emitting element L is not affected by a voltage drop of a first power supply line transmitting the first voltage Vdd and the threshold voltage Vth of the driving sub-circuit 410. Therefore, the above-mentioned pixel circuit may improve the uniformity of the driving current flowing through the light-emitting element L, and achieve the uniformity of light-emitting brightness.

For example, in some embodiments of the present disclosure, with reference to FIG. 6, the first initialization sub-circuit 110 includes a seventh transistor T7. The second initialization sub-circuit 120 includes a first transistor T1. The third initialization sub-circuit 130 includes an eighth transistor T8. The first light-emitting control sub-circuit 210 includes a fifth transistor T5. The second light-emitting control sub-circuit 220 includes a sixth transistor T6. The driving sub-circuit 410 includes a third transistor T3. The compensation sub-circuit 510 includes a second transistor T2. The data writing sub-circuit 310 includes a fourth transistor T4. The storage sub-circuit 610 may include a first capacitor C1. The potential maintaining sub-circuit 620 may include a second capacitor C2. The light-emitting element L may be an organic light-emitting diode.

Each transistor includes a control electrode of the transistor, that is, a gate; a first electrode of the transistor, that is, one of a source or a drain; and a second electrode of the transistor, that is, the other one of the source or the drain.

The first capacitor C1 may include a first electrode plate C1a and a second electrode plate C1b. The first electrode plate C1a of the first capacitor C1 is electrically connected to the first node N1, that is, the first electrode plate C1a of the first capacitor C1 is electrically connected to a gate of the third transistor and a first electrode of the second transistor. The second electrode plate C1b of the first capacitor C1 is electrically connected to the fourth node N4, that is, the second electrode plate C1b of the first capacitor C1 is electrically connected to the second electrode plate C2b of the second capacitor C2, a first electrode of the fourth transistor and a first electrode of the seventh transistor.

The second capacitance C2 may include a first electrode plate C2a and a second electrode plate C2b. The first electrode plate C2a of the second capacitance C2 is electrically connected to the fourth node N4. The second electrode plate C2b of the second capacitance C2 is electrically connected to the fifth transistor T5, that is, the second electrode plate C2b of the second capacitor is electrically connected to the first voltage terminal VDD.

A control electrode (gate) of the first transistor T1 is electrically connected to the second reset signal terminal GN4. A first electrode of the first transistor T1 is electrically connected to the second initialization signal terminal Vi2. A second electrode of the first transistor T1 is electrically connected to the first electrode of the light-emitting element L. For example, the second initialization signal terminal Vi2 is used to provide a second initialization signal.

A control electrode (gate) of the second transistor T2 is electrically connected to the compensation signal terminal GN2. A first electrode of the second transistor T2 is electrically connected to the first node N1. A second electrode of the second transistor T2 is electrically connected to the third node N3. That is, the first electrode of the second transistor T2 is electrically connected to a gate of the third transistor T3 and the first electrode plate C1a of the first capacitor C1, and the second electrode of the second transistor T2 is electrically connected to a second electrode of the third transistor T3, a first electrode of the sixth transistor T6 and a first electrode of the eighth transistor T8.

A control electrode (gate) of the third transistor T3 is electrically connected to the first node N1. A first electrode of the third transistor T3 is electrically connected to the second node N2. A second electrode of the third transistor T3 is electrically connected to the node N3.

A control electrode (gate) of the fourth transistor T4 is electrically connected to the scanning signal terminal GN1. A second electrode of the fourth transistor T4 is electrically connected to the data signal terminal Vdata. A first electrode of the fourth transistor T4 is electrically connected to the fourth node N4.

A control electrode (gate) of the fifth transistor T5 is electrically connected to the first light-emitting control terminal EM1. A first electrode of the fifth transistor T5 is electrically connected to the first voltage terminal VDD. A second electrode of the fifth transistor T5 is electrically connected to the first electrode of the third transistor T3. The first voltage terminal VDD is used to provide a high voltage Vdd.

A control electrode (gate) of the sixth transistor T6 is electrically connected to the second light-emitting control terminal EM2. A first electrode of the sixth transistor T6 is electrically connected to the node N3, that is, the first electrode of the sixth transistor T6 is electrically connected to the second electrode of the third transistor T3 and the second electrode of the second transistor T2. A second electrode of the sixth transistor T6 is electrically connected to the first electrode of the light-emitting element L. The first electrode of the light-emitting element L may be an anode.

A control electrode (gate) of the seventh transistor T7 is electrically connected to the first reset signal terminal GN3. A second electrode of the seventh transistor T7 is electrically connected to the first initialization signal terminal Vi1. A first electrode of the seventh transistor T7 is electrically connected to the fourth node N4, that is, the first electrode of the seventh transistor T7 is electrically connected to the first electrode of the fourth transistor T4, the second electrode plate C1b of the first capacitor C1 and the first electrode plate C2a of the second capacitor C2. For example, the first initialization signal terminal Vi1 is used to provide a first initialization signal.

A control electrode (gate) of the eighth transistor T8 is electrically connected to the third reset signal terminal GN5. A first electrode of the eighth transistor T8 is electrically connected to the third node N3. A second electrode of the eighth transistor T8 is electrically connected to the third initialization signal terminal Vi3.

The first electrode of the light-emitting element L is electrically connected to the second electrode of the sixth transistor, and the second electrode of the light-emitting element L is electrically connected to the second voltage terminal VSS. The second voltage terminal VSS is used to provide a low voltage Vss.

In the embodiments of the present disclosure, any two of Vi1, Vi2, and Vi3 may be the same or different.

In the embodiments of the present disclosure, the second reset signal terminal GN4 and the third reset signal terminal GN5 are the same reset signal terminal.

In the embodiments of the present disclosure, the second transistor T2, the fourth transistor T4 and the seventh transistor T7 may be oxide thin film transistors, while other transistors such as the first transistor T1, the third transistor T3, the fifth transistor T5, the sixth transistor T6 and the eighth transistor T8 may be low-temperature poly-silicon thin film transistors. However, the embodiments of the present disclosure are not limited to this.

In at least one embodiment of the pixel circuit of the present disclosure, the voltage value of Vi1 may be greater than or equal to −6V and less than or equal to −2V For example, the voltage value of Vi1 may be −2V, −3V, −4V, −5V, or −6V, which is not limited to this.

The threshold voltage Vth of a transistor may be greater than or equal to −5V and less than or equal to −0.5V For example, Vth may be −2.5V or −3V, etc.

The voltage value of the high voltage Vdd provided by the first voltage terminal VDD may be greater than or equal to 3V and less than or equal to 6V. For example, the voltage value of Vdd may be 4.6V, which is not limited to this.

An absolute value of the voltage value of the high voltage Vdd may be greater than 1.5 times an absolute value of Vth. For example, the absolute value of the voltage value of Vdd may be 1.6 times, 1.8 times, 2 times the absolute value of Vth, etc.

Optionally, the voltage value of the low voltage Vss provided by the second voltage terminal VSS may be greater than or equal to −6V and less than or equal to −3V For example, the voltage value of Vss may be −5V, −4V, or −3V.

In at least one embodiment of the present disclosure, the voltage value of Vi2 may be greater than or equal to −7V and less than or equal to 0V. For example, the voltage value of the second initialization voltage may be −6V, −5V, −4V, −3V, or −2V, which is not limited to this.

Optionally, a voltage difference between the voltage value of Vi2 and the voltage value of VSS requires to be less than a turn-on voltage of the light-emitting element, so that when the first electrode of the light-emitting element is connected to Vi2, the light-emitting element does not emit light.

Figure 7:
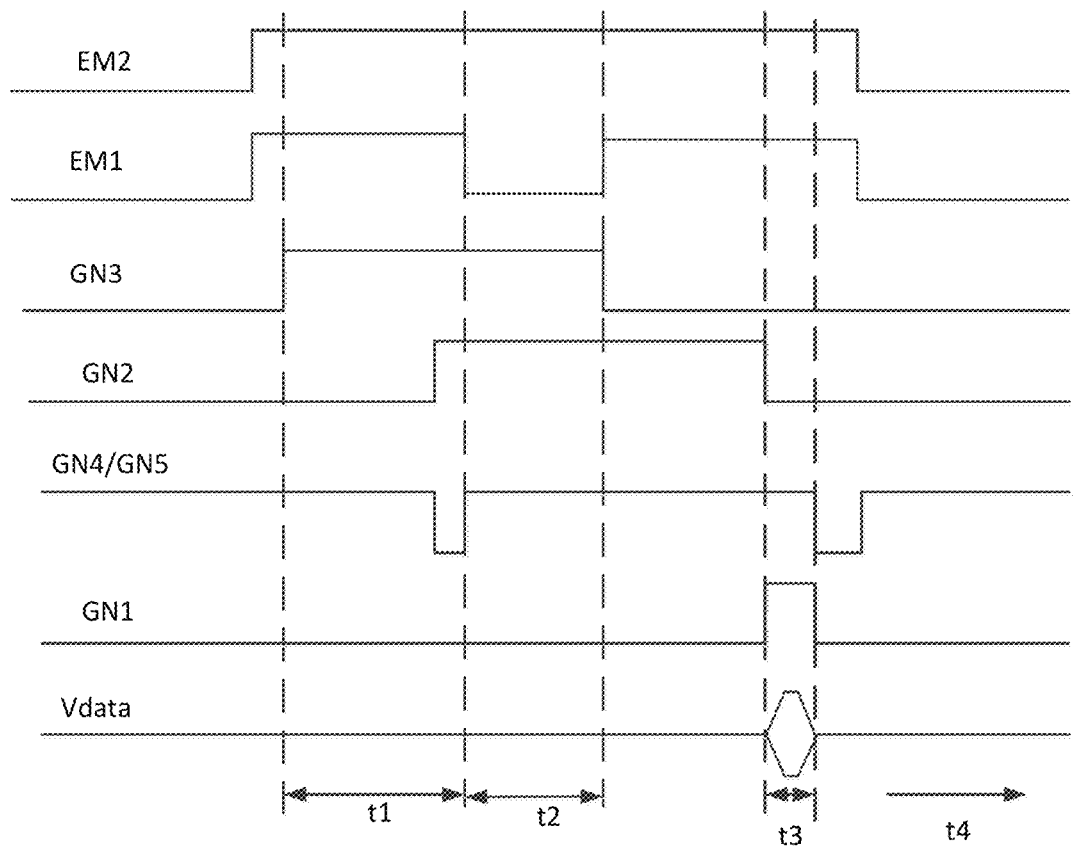
FIG. 7 is a working timing diagram of at least one embodiment of a method for driving the pixel circuit shown in FIG. 6.

FIG. 7 is a working timing diagram of at least one embodiment of a method for driving a pixel circuit shown in FIG. 6. With reference to FIG. 5 to FIG. 7, when the pixel circuit according to the embodiments of the present disclosure works, a display period may include a reset stage t1, a compensation stage t2, a data writing stage t3 and a light-emitting stage t4 which are sequentially set.

In the reset stage t1, a potential of the first light-emitting control signal provided by the first light-emitting control terminal EM1 is converted from a low voltage Vgl to a high voltage Vgh, and the fifth transistor T5 is controlled to be turned off. The second light-emitting control signal provided by the second light-emitting control terminal EM2 is converted from the low voltage Vgl to the high voltage Vgh, and the sixth transistor T6 is controlled to be turned off. After a short interval of time, the first reset signal provided by the first reset signal terminal GN3 is converted from the low voltage Vgl to the high voltage Vgh, the seventh transistor is controlled to be turned on, and the first initialization voltage $V_{i1}$ is written into the fourth node N4. At this time, $V_{N4}=V_{i1}$. Then, after a certain interval of time, the compensation signal provided by the compensation signal terminal GN2 is converted from the low voltage Vgl to the high voltage Vgh, and the second transistor T2 is controlled to be turned on. At the same time, the third reset signal provided by the third reset signal terminal GN5 is converted from the high voltage Vgh to the low voltage Vgl, the eighth transistor T8 is controlled to be turned on, and the third initialization voltage Vi3 is written into the first node N1.

For example, in the reset stage of the image frame, the first initialization sub-circuit 110 transmits the first initialization signal received at the first initialization signal terminal Vi1 to the fourth node N4, in response to the first reset signal received at the first reset signal terminal GN3, so as to initialize a potential of the fourth node N4. After a preset time interval, the third initialization sub-circuit 130 transmits the third initialization signal received at the third initialization signal terminal Vi3 to the third node N3, in response to the third reset signal received at the third reset signal terminal GN5, and the compensation sub-circuit 510 is conducted, in response to the compensation control signal received at the compensation signal terminal GN2, so that the third initialization signal Vi3 is transmitted to the first node N1, so as to initialize the potential of the first node N1.

In the compensation stage t2, the third reset signal provided by the third reset signal terminal GN5 is converted from the low voltage Vgl to the high voltage Vgh, and the eighth transistor T8 is controlled to be turned off. The compensation signal provided by the compensation signal terminal GN2 continues to maintain high voltage, the second transistor T2 is controlled to be continuously turned on and the first reset signal provided by the first reset signal terminal GN3 is controlled to continuously maintain the high voltage, and the seventh transistor T7 is controlled to be turned on. At this time, the first light-emitting control signal provided by the first light-emitting control terminal EM1 is converted from the high voltage Vgh to the low voltage Vgl, and the fifth transistor T5 is controlled to be turned on. The first voltage Vdd provided by the first voltage terminal VDD is sequentially written into the second node N2, the third node N3 and the first node N1. At this time, the voltage $V_{N1}$ of the first node N1 is $V_{N1}$=Vdd+Vth.

For example, with reference to FIG. 5 to FIG. 7, in the compensation stage of the image frame, the first light-emitting control sub-circuit 210 writes the first voltage received at the first voltage terminal VDD into the second node N2, in response to the first light-emitting control signal. In response to the first reset signal and the compensation control signal, the first initialization sub-circuit 120 and the compensation sub-circuit 510 are conducted, so that the first voltage Vdd from the first voltage terminal VDD and the threshold voltage Vth of the driving sub-circuit 410 are transmitted to the first node N1. The time of the compensation stage may be determined by adjusting the first light-emitting control signal, the first reset signal and the compensation control signal, so as to ensure sufficient voltage compensation for the first node N1, and improve the driving effect of the pixel circuit on the light-emitting element L.

With continued reference to FIG. 5 to FIG. 7, before the data writing stage t3, the first reset signal provided by the first reset signal terminal GN3 is converted from the high voltage Vgh to the low voltage Vgl, and the seventh transistor T7 is controlled to be turned off. In the data writing stage t3, the compensation signal provided by the compensation signal terminal GN2 is converted from the high voltage Vgh to the low voltage Vgl, and the second transistor T2 is controlled to turn off. The scanning signal provided by the scanning signal terminal GN1 is converted from the low voltage Vgl to the high voltage Vgh, and the fourth transistor T4 is controlled to be turned on. The data signal provided by the data signal terminal $V_{data}$ is written into the fourth node N4, thereby causing the capacitance change amount $\Delta V_{N4}$ of the first capacitor C1 is: $\Delta V_{N4}=V_{data}+V_{i1}$.

Due to the bootstrap effect (i.e. an effect that an voltage at two terminals of the capacitor may not suddenly change, and when the voltage of one terminal increases, the voltage of the other one terminal still maintains the voltage difference with this terminal and the previous one terminal) of the capacitor, when the voltage change $\Delta V_{N4}$ of the fourth node N4 is $V_{data}+V_{i1}$, the voltage $V_{N1}$ of the first node N1 will finally stabilize at $V_{N1}=V_{data}+V_{i1}+Vdd+Vth$.

In the light-emitting stage t4, the scanning signal provided by the scanning signal terminal GN1 is converted from the high voltage Vgh to the low voltage Vgl, and the fourth transistor T4 is controlled to be turned off. The reset signal provided by the second reset signal terminal GN4 is converted from the high voltage Vgh to the low voltage Vgl, the first transistor T1 is controlled to be turned on and Vi2 is written into the first electrode of the light-emitting element L. Subsequently, the reset signal provided by the second reset signal terminal GN4 is converted from the low voltage Vgl to the high voltage Vgh, and the first transistor T1 is controlled to be turned off. Then, the first light-emitting control signal provided by the first light-emitting control terminal EM1 is converted from the high voltage Vgh to the low voltage Vgl, and the fifth transistor T5 is controlled to be turned on The second light-emitting control signal provided by the second light-emitting control terminal EM2 is converted from the high voltage Vgh to the low voltage Vgl, and the sixth transistor T6 is controlled to be turned on. At this time, since the voltage difference ($V_{data}+V_{i1}$+Vth) between the first voltage terminal VDD and the first node N1 is greater than the threshold voltage Vth of the driving sub-circuit 410, the third transistor T3 is conducted in response to the voltage $V_{N1}$ of the first node N1 and generates a driving current I. The driving circuit satisfies the following equation:

$$I = 1/2 \cdot K \cdot (Vgs - Vth)^2 = 1/2 \cdot K \cdot (V_{N1} - Vdd - Vth)^2 = 1/2 \cdot K \cdot (V_{data} + V_{i1})^2$$

where K is a fixed constant related to the process parameters and geometric dimensions of the driving sub-circuit 410. Vgs is a gate source voltage difference of the driving transistor in the driving sub-circuit 410.

The light-emitting element L emits light due to the driving effect of the driving current I.

In the embodiments of the present disclosure, the second transistor T2 included in the compensation sub-circuit, the fourth transistor T4 included in the data writing sub-circuit, and the seventh transistor T7 included in the first initialization sub-circuit may be oxide thin film transistors. In this way, it may reduce the leakage at the control terminal of the driving circuit, ensure the stability of the voltage of the control terminal of the driving circuit, which is beneficial for improving display quality, enhancing display uniformity and reducing flicker.

In the embodiments of the present disclosure, the first transistor T1 may be controlled by a separate GOA. The separate GOA is electrically connected to the second reset signal terminal GN4, so that the light-emitting element L may be reset at a specific frequency, such as 240 Hz.

In the embodiments of the present disclosure, the second reset signal provided by the second reset signal terminal GN4 may be a high frequency signal. By increasing the frequency of the second reset signal provided by the second reset signal terminal GN4, the refresh frequency of the first electrode reset of the light-emitting element L may be increased, so that the brightness establishment time of the refresh stage of the light-emitting element L is consistent with the brightness establishment time of the maintaining stage of the light-emitting element L. In this way, the low component in the light-emitting maintenance phase may be reduced, the brightness changes visible to the naked eye may be reduced, the flicker level may be improved, and at the same time, the loading may be reduced and the power consumption may be reduced.

It should be noted that in the embodiments of the present disclosure, each thin film transistor T1, T2, T3, T4, T5, T6, T7 and T8 may be p-channel field-effect transistors. However, the embodiments of the present disclosure are not limited to this, and at least some of the thin film transistors T1, T2, T3, T4, T5, T6, T7, and T8 may be n-channel field-effect transistors.

Figure 8:
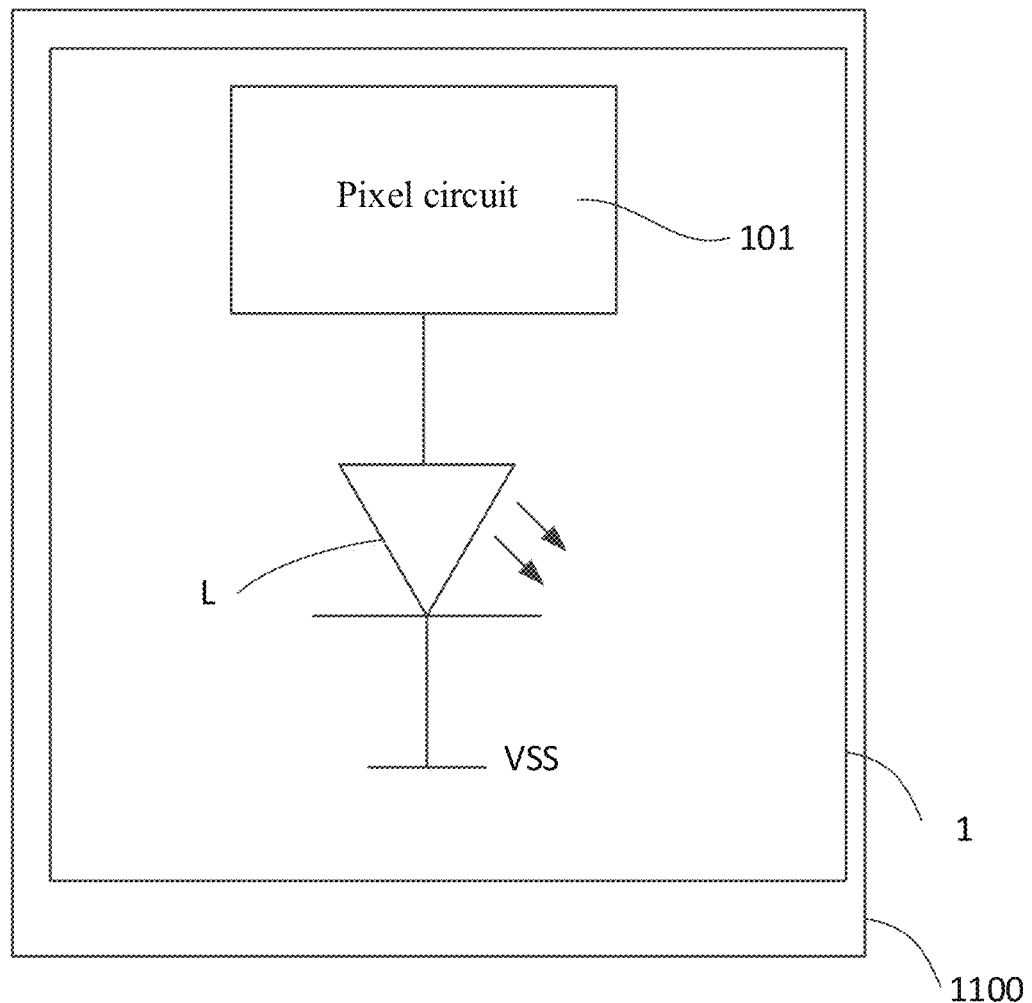
FIG. 8 is a schematic diagram of a structure of a display substrate according to an exemplary embodiment of the present disclosure.

FIG. 8 is a schematic diagram of a structure of a display substrate according to some exemplary embodiments of the present disclosure.

With reference to FIG. 8, for example, the present disclosure provides a display substrate 1100. The display substrate 1100 includes a base substrate 1; a pixel circuit 101 disposed on the base substrate 1 and a light-emitting element L disposed on the base substrate 1. The pixel circuit 101 includes the pixel circuit as described above. The light-emitting element L is coupled to the pixel circuit 101.

Figure 9:
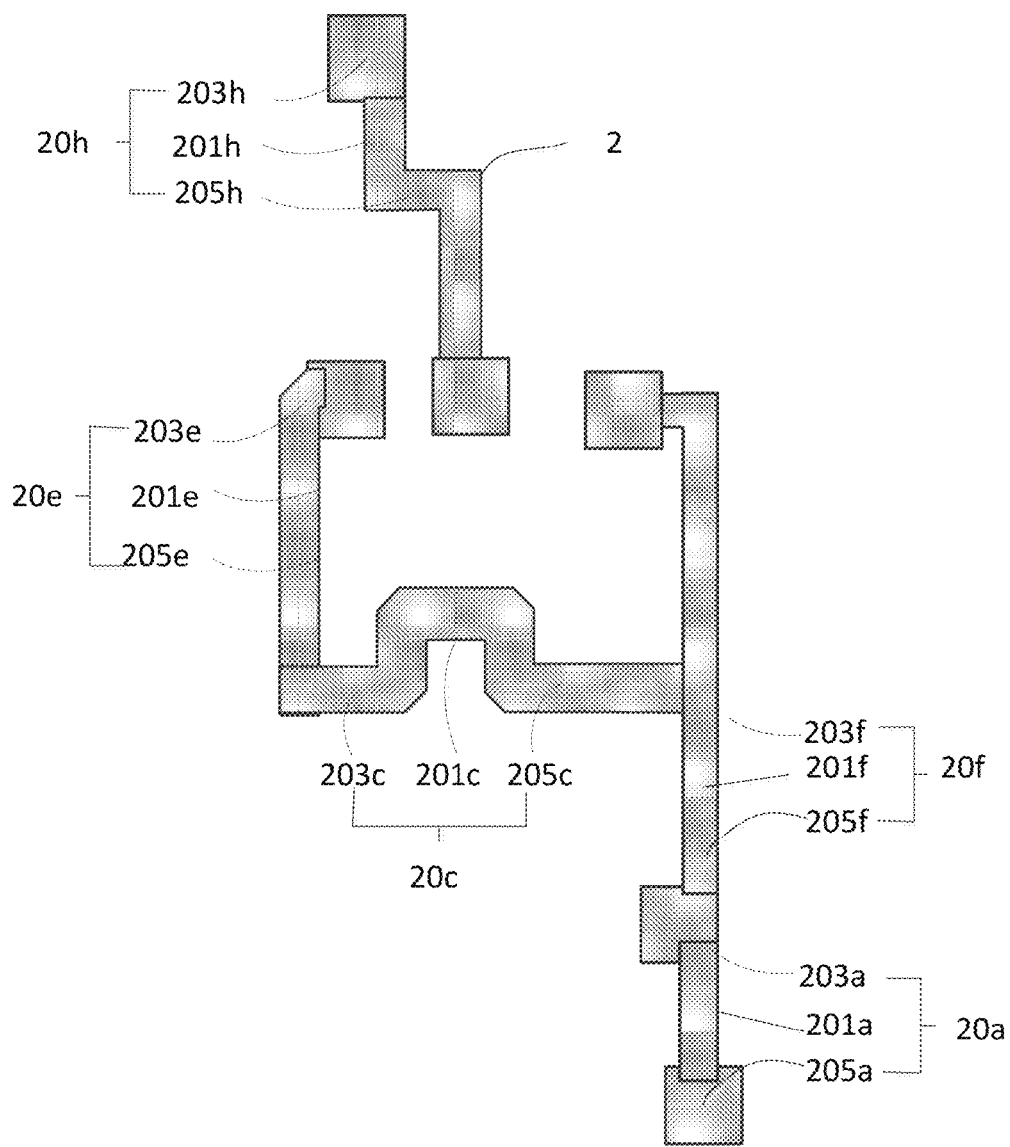
FIG. 9 is a schematic diagram of a planar structure of a first semiconductor layer of a pixel circuit according to an exemplary embodiment of the present disclosure.
Figure 10:
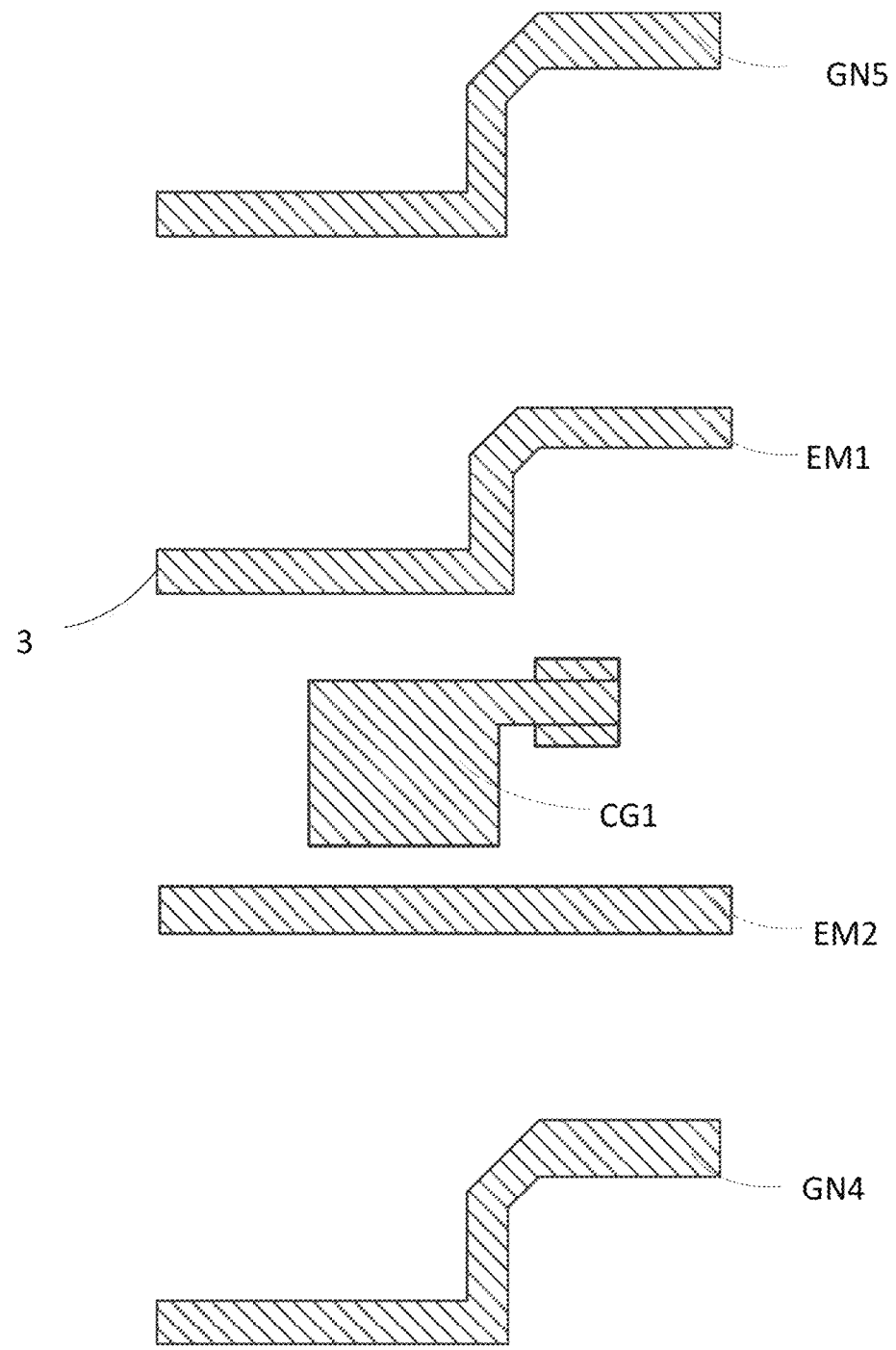
FIG. 10 is a schematic diagram of a planar structure of a first conductive layer of a pixel circuit according to an exemplary embodiment of the present disclosure.
Figure 11:
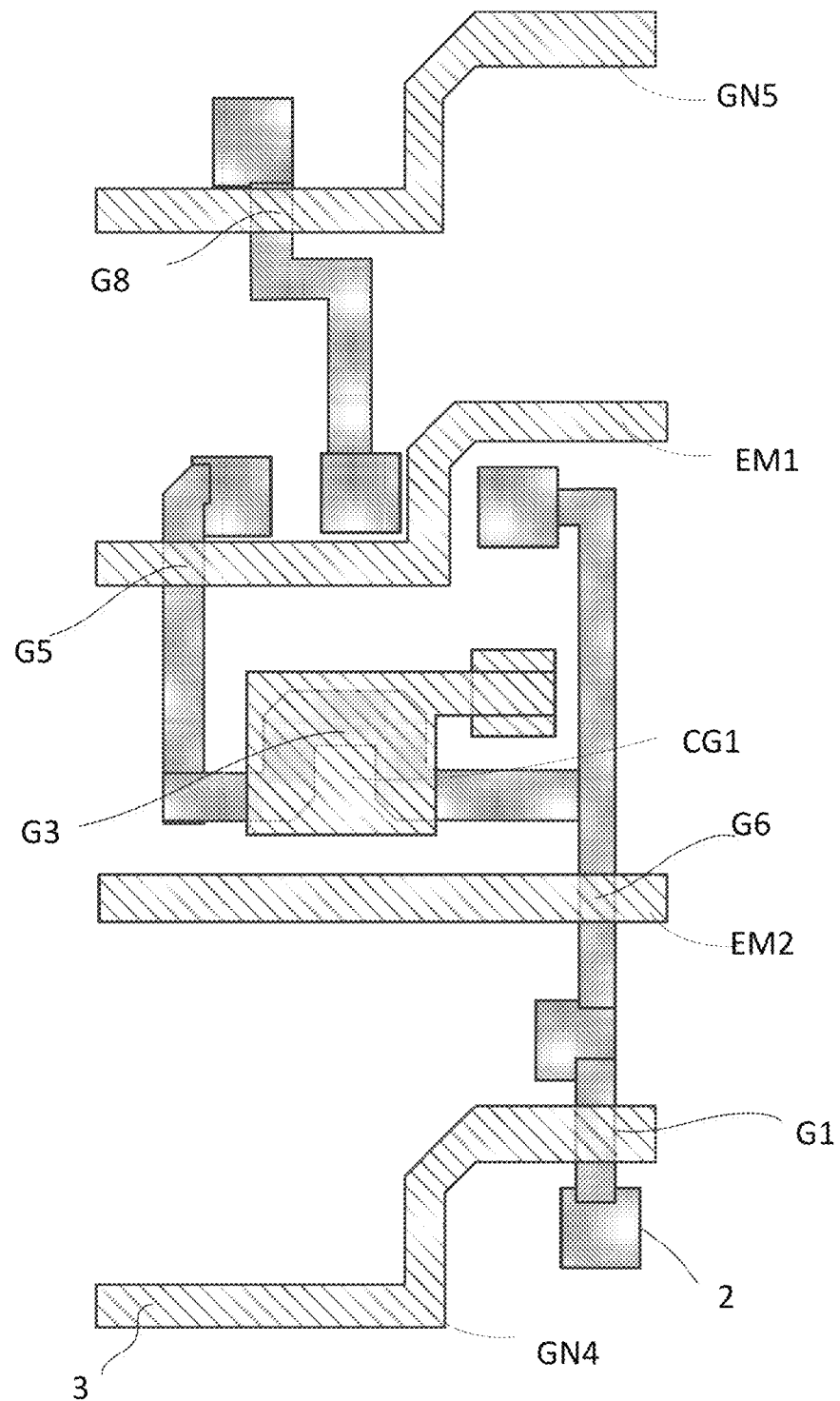
FIG. 11 is a schematic diagram of a planar structure of a combination of a first semiconductor layer and a first conductive layer of a pixel circuit according to an exemplary embodiment of the present disclosure.
Figure 12:
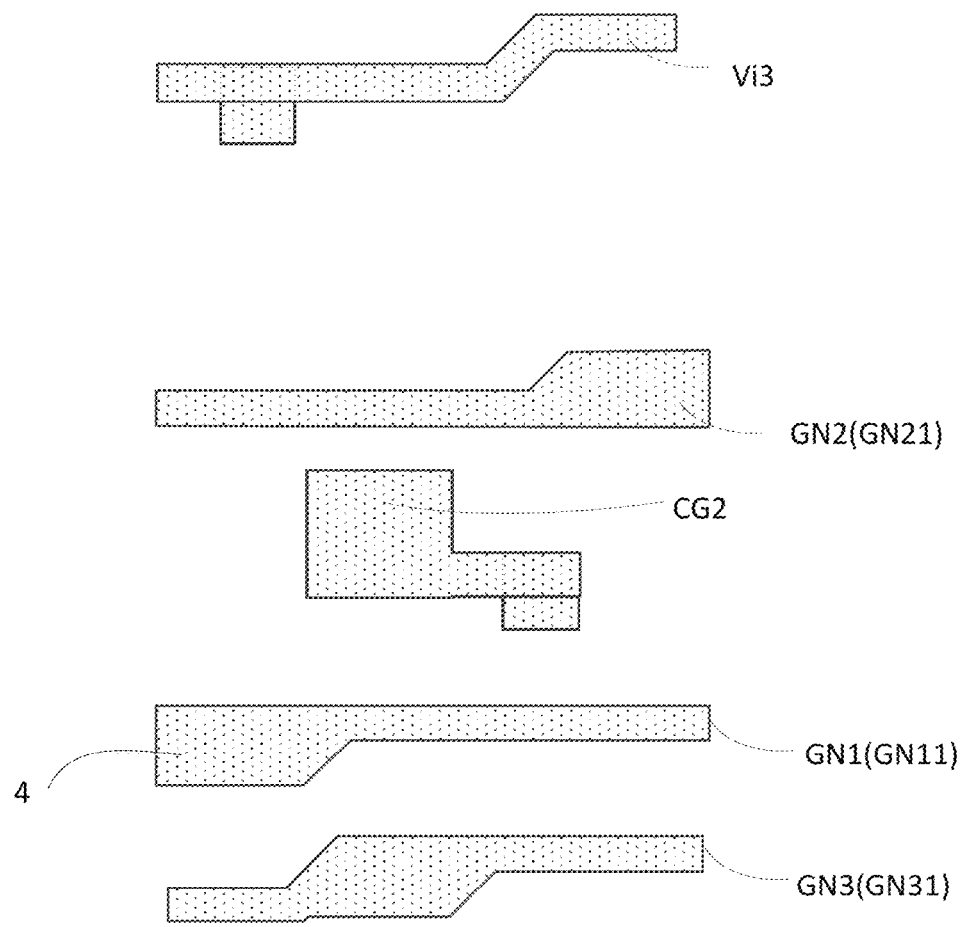
FIG. 12 is a schematic diagram of a planar structure of a second conductive layer of a pixel circuit according to an exemplary embodiment of the present disclosure.
Figure 13:
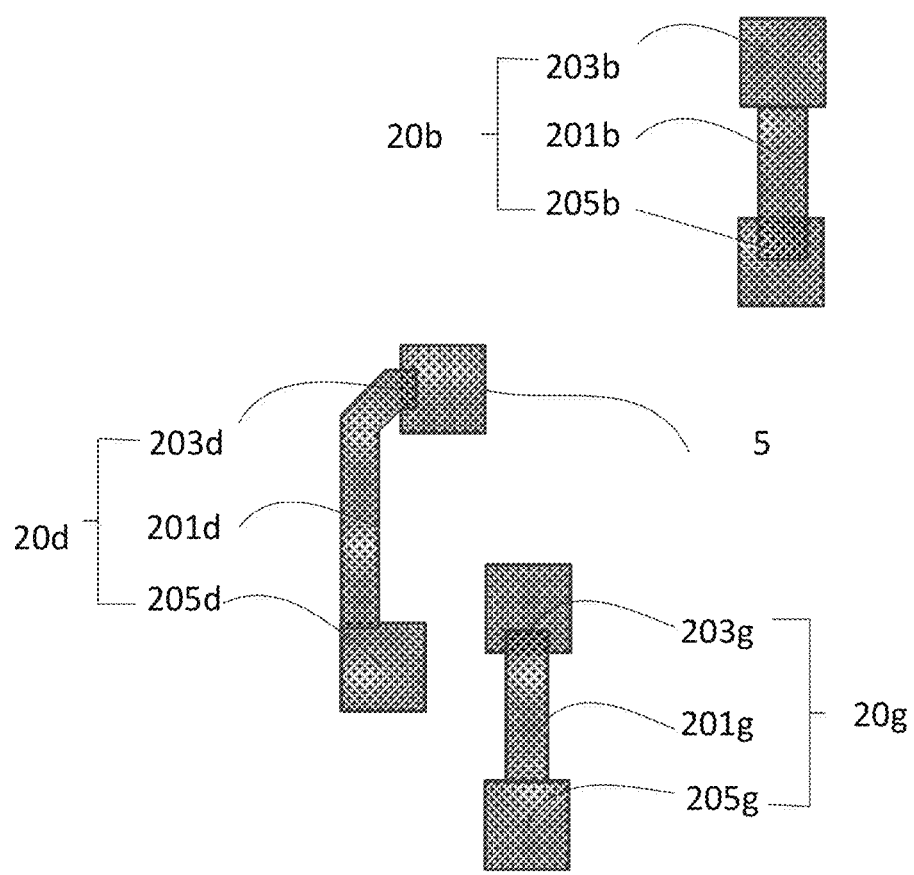
FIG. 13 is a schematic diagram of a planar structure of a second semiconductor layer of a pixel circuit according to an exemplary embodiment of the present disclosure.
Figure 14:
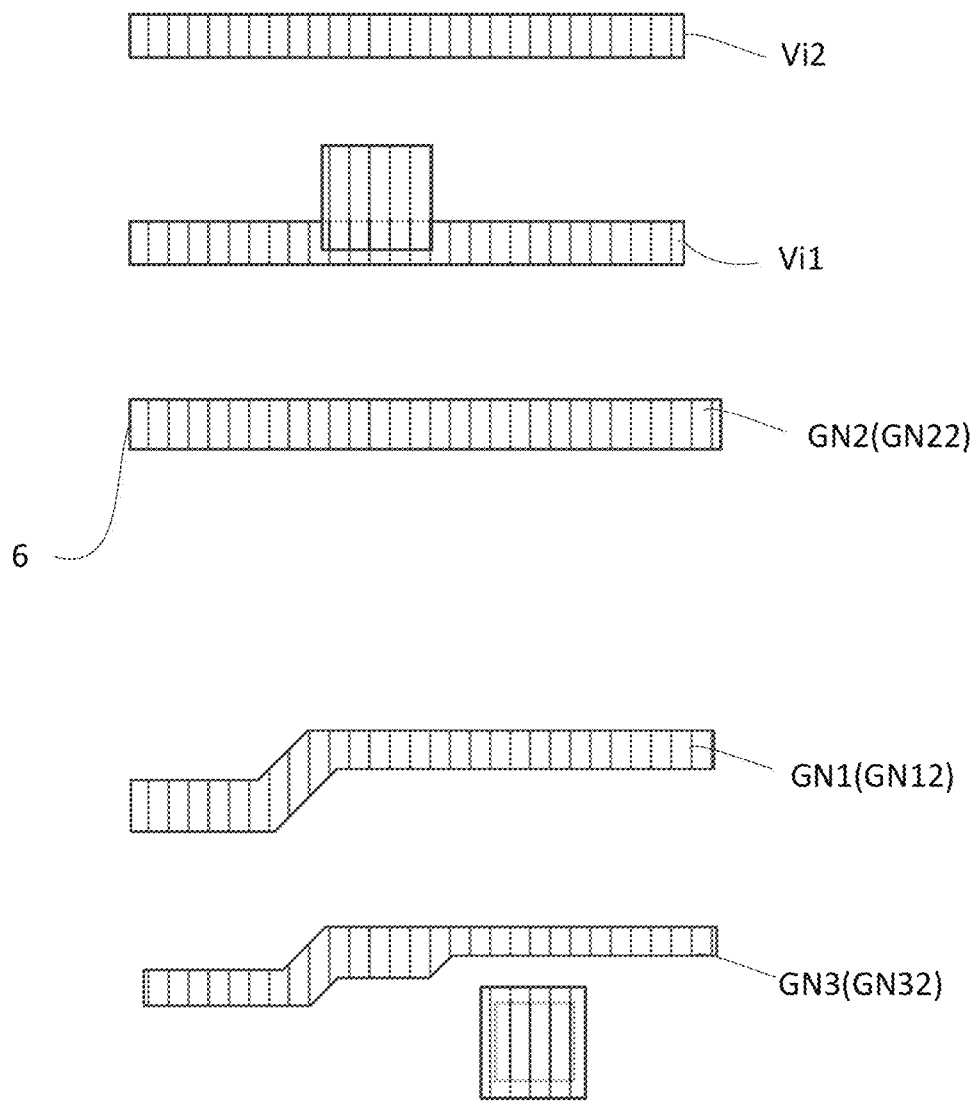
FIG. 14 is a schematic diagram of a planar structure of a third conductive layer of a pixel circuit according to an exemplary embodiment of the present disclosure.
Figure 15:
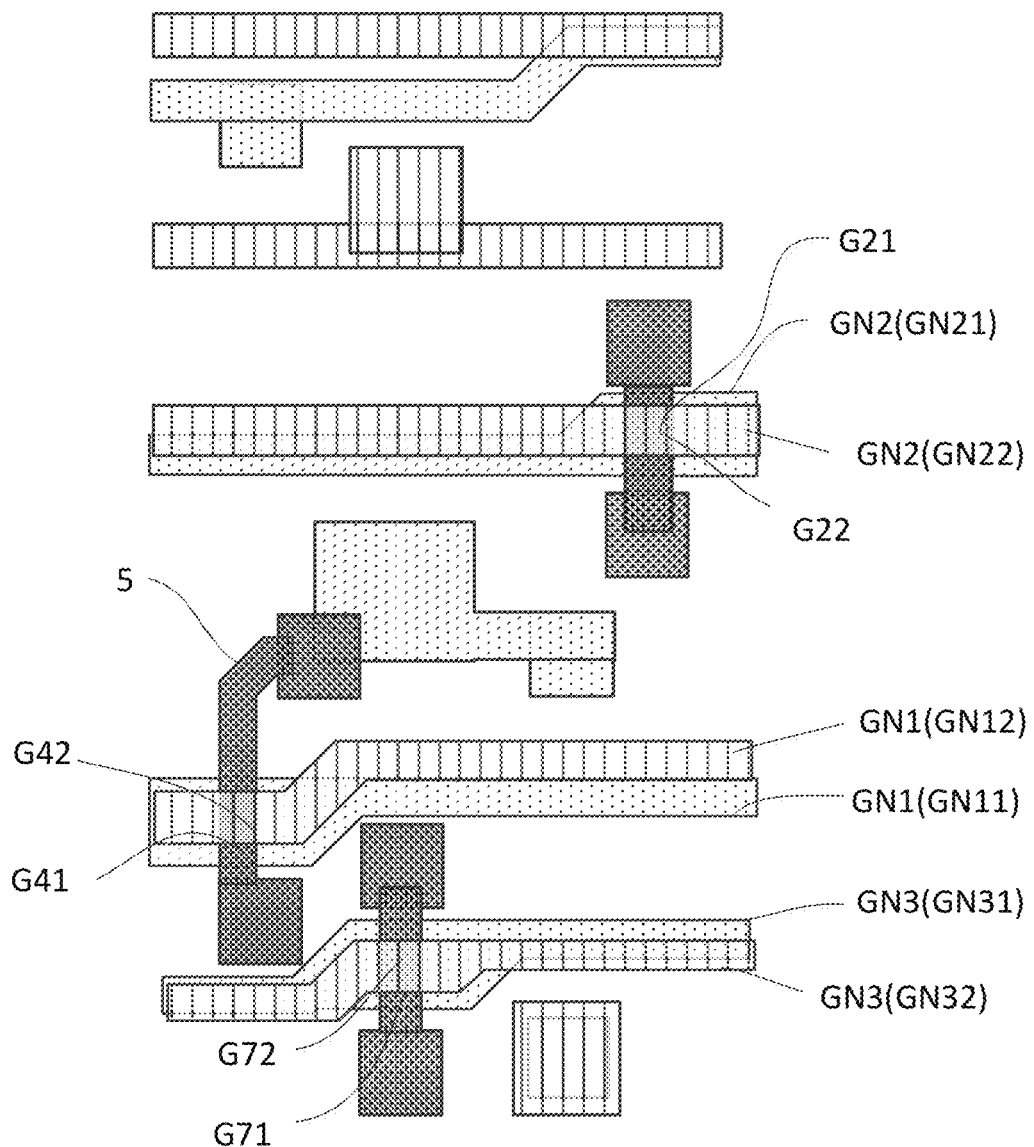
FIG. 15 is a schematic diagram of a planar structure of a combination of a second conductive layer, a second semiconductor layer and a third conductive layer of a pixel circuit according to an exemplary embodiment of the present disclosure.
Figure 16:
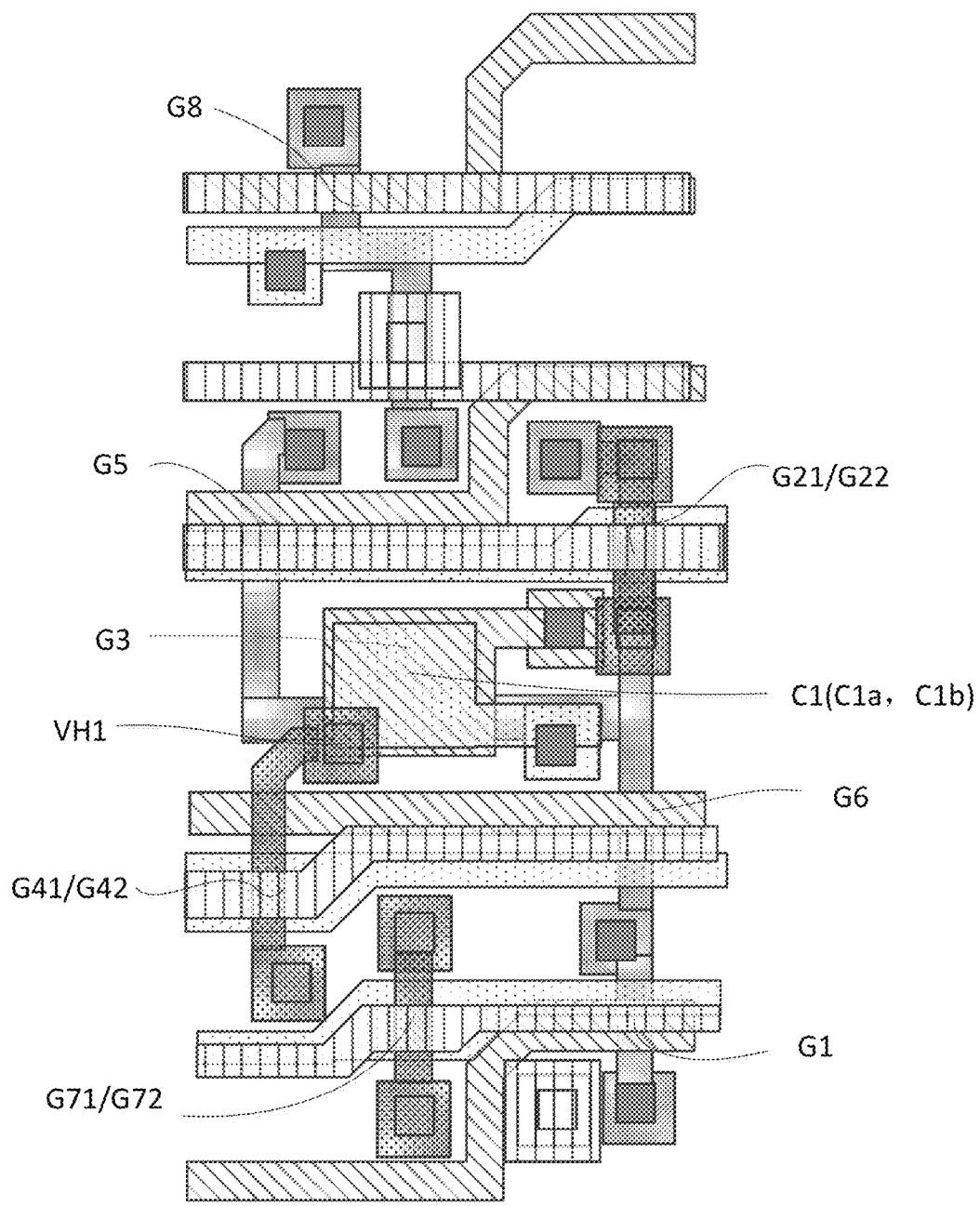
FIG. 16 is a schematic diagram of a planar structure of a combination of a first semiconductor layer, a first conductive layer, a second conductive layer, a second semiconductor layer and a third conductive layer of a pixel circuit according to an exemplary embodiment of the present disclosure.
Figure 17:
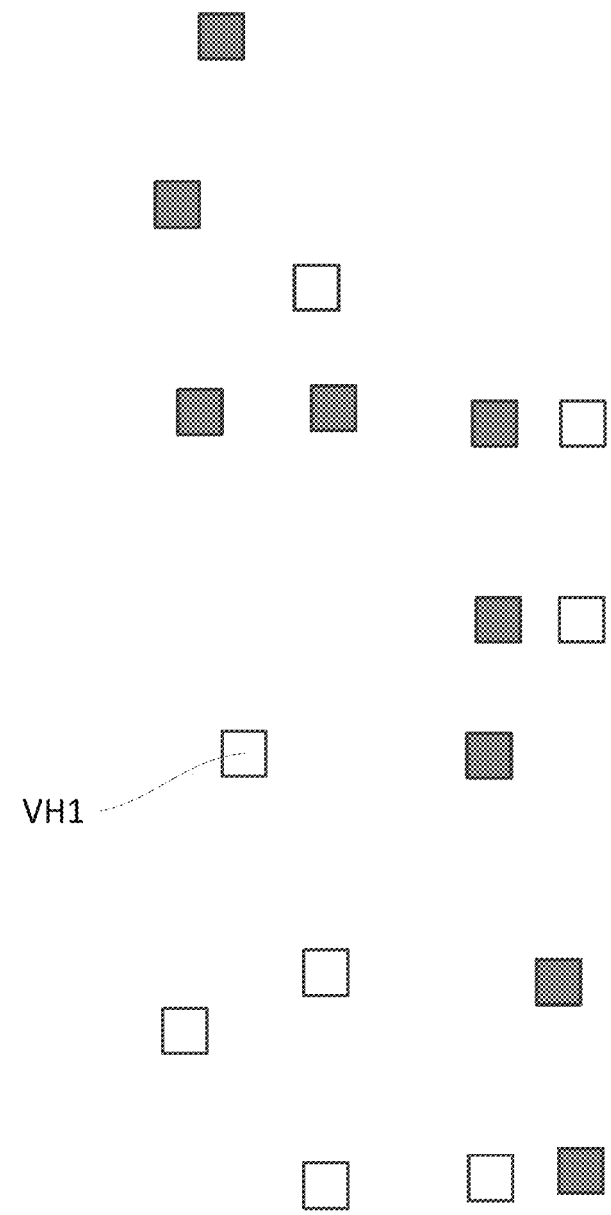
FIG. 17 is a schematic diagram of a via hole in an insulation layer formed on the structure of FIG. 16.
Figure 18:
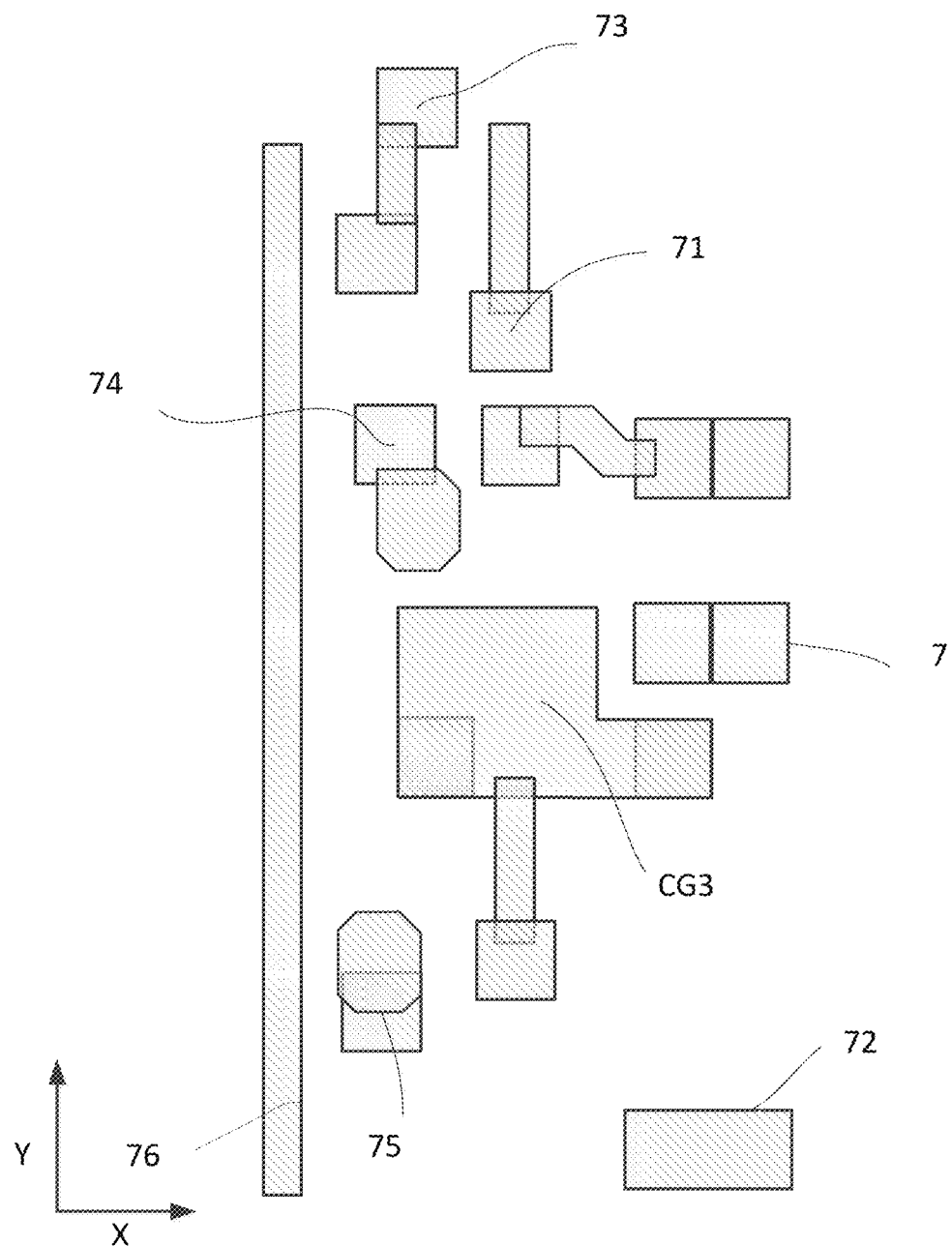
FIG. 18 is a schematic diagram of a planar structure of a fourth conductive layer of a pixel circuit according to an exemplary embodiment of the present disclosure.
Figure 19:
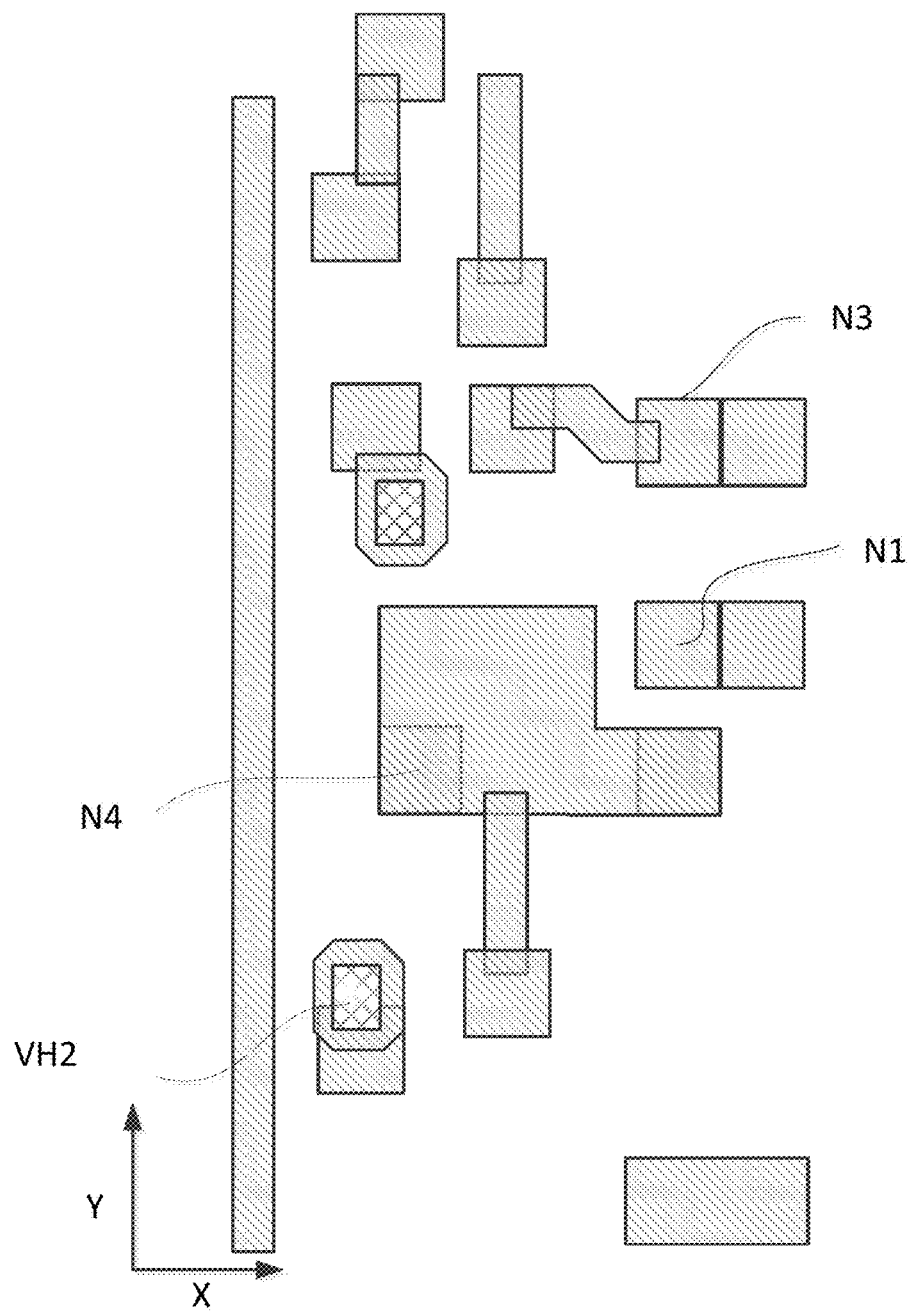
FIG. 19 is a schematic diagram of a via hole in an insulation layer formed on the structure of FIG. 18.
Figure 20:
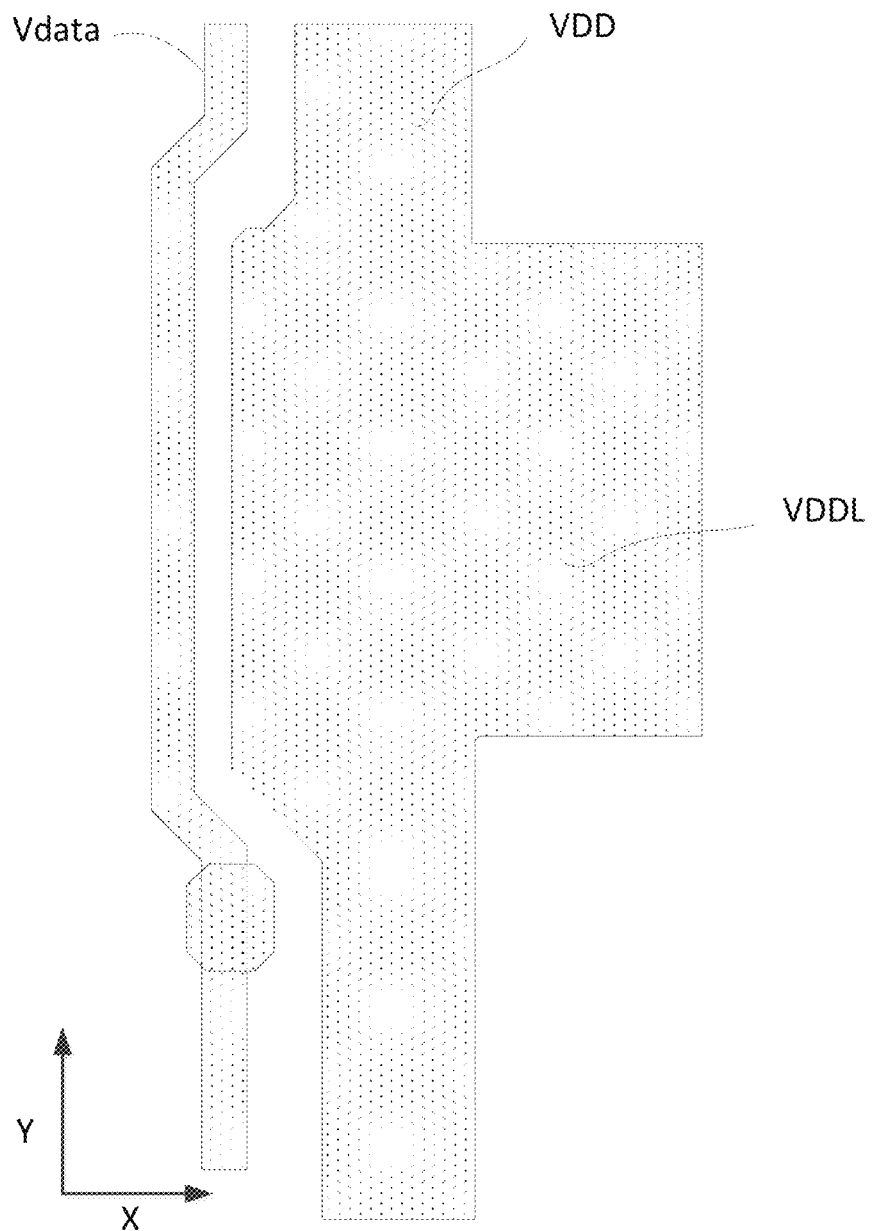
FIG. 20 is a schematic diagram of a planar structure of a fifth conductive layer of a pixel circuit according to an exemplary embodiment of the present disclosure.
Figure 21:
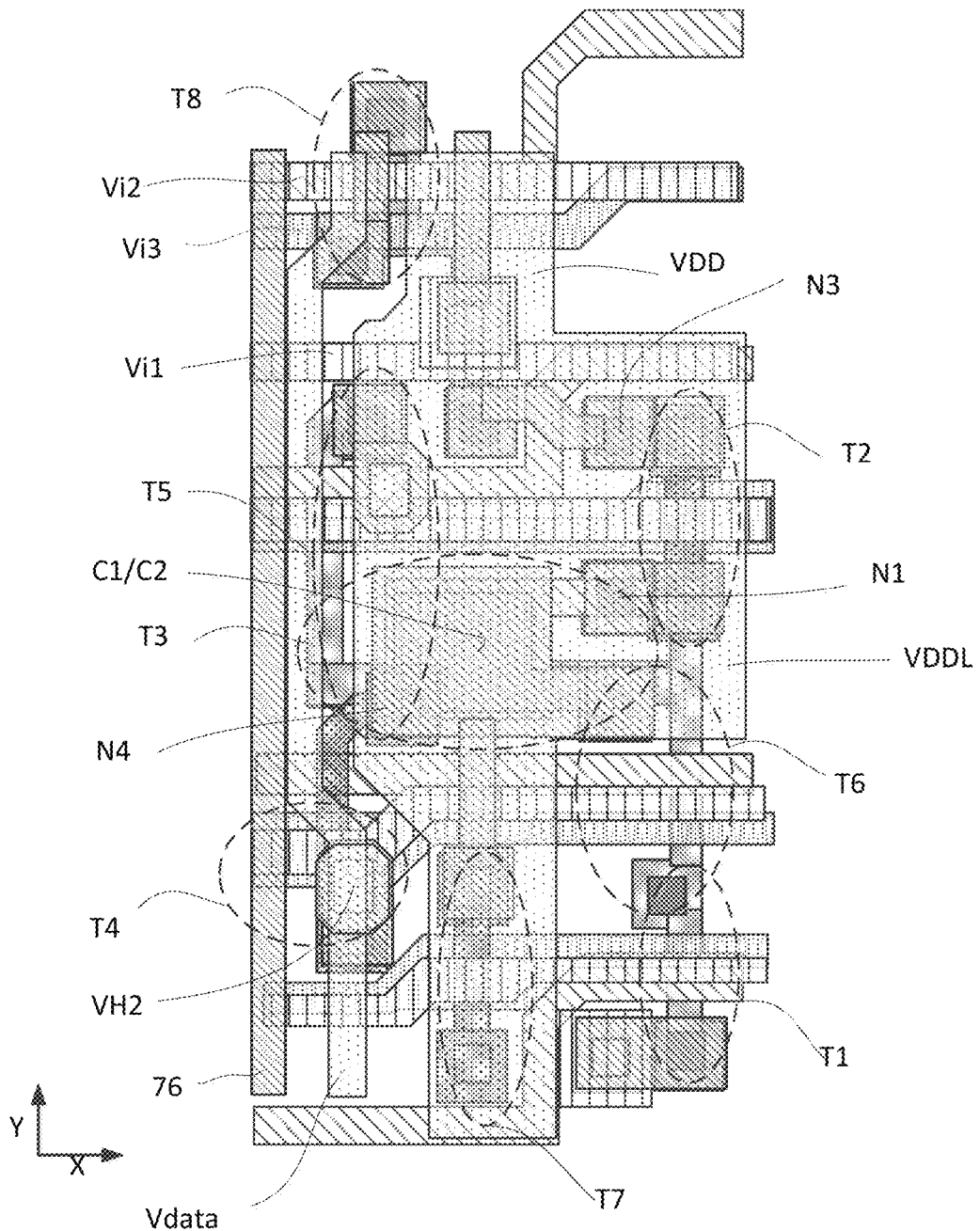
FIG. 21 is a schematic diagram of a planar structure of a combination of a first semiconductor layer, a first conductive layer, a second conductive layer, a second semiconductor layer, a third conductive layer, a fourth conductive layer and a fifth conductive layer of a pixel circuit according to an exemplary embodiment of the present disclosure.

FIG. 9 is a schematic diagram of a planar structure of a first semiconductor layer of a pixel circuit according to an exemplary embodiment of the present disclosure. FIG. 10 is a schematic diagram of a planar structure of a first conductive layer of a pixel circuit according to an exemplary embodiment of the present disclosure. FIG. 11 is a schematic diagram of a planar structure of a combination of a first semiconductor layer and a first conductive layer of a pixel circuit according to an exemplary embodiment of the present disclosure. FIG. 12 is a schematic diagram of a planar structure of a second conductive layer of a pixel circuit according to an exemplary embodiment of the present disclosure. FIG. 13 is a schematic diagram of a planar structure of a second semiconductor layer of a pixel circuit according to an exemplary embodiment of the present disclosure. FIG. 14 is a schematic diagram of a planar structure of a third conductive layer of a pixel circuit according to an exemplary embodiment of the present disclosure. FIG. 15 is a schematic diagram of a planar structure of a combination of a second conductive layer, a second semiconductor layer and a third conductive layer of a pixel circuit according to an exemplary embodiment of the present disclosure. FIG. 16 is a schematic diagram of a planar structure of a combination of a first semiconductor layer, a first conductive layer, a second conductive layer, a second semiconductor layer and a third conductive layer of a pixel circuit according to an exemplary embodiment of the present disclosure. FIG. 17 is a schematic diagram of a via hole in an insulation layer formed on the structure of FIG. 16. FIG. 18 is a schematic diagram of a planar structure of a fourth conductive layer of a pixel circuit according to an exemplary embodiment of the present disclosure. FIG. 19 is a schematic diagram of a via hole in an insulation layer formed on the structure of FIG. 18. FIG. 20 is a schematic diagram of a planar structure of a fifth conductive layer of a pixel circuit according to an exemplary embodiment of the present disclosure. FIG. 21 is a schematic diagram of a planar structure of a combination of a first semiconductor layer, a first conductive layer, a second conductive layer, a second semiconductor layer, a third conductive layer, a fourth conductive layer and a fifth conductive layer of a pixel circuit according to an exemplary embodiment of the present disclosure.

For example, with reference to FIG. 9 to FIG. 21, in some embodiments of the present disclosure, the display substrate includes a base substrate and a plurality of film layers disposed on the base substrate. In some embodiments, the plurality of film layers include at least a first semiconductor layer 2, a first conductive layer 3, a second conductive layer 4, a second semiconductor layer 5, a third conductive layer 6, a fourth conductive layer 7 and a fifth conductive layer 8. The first semiconductor layer 2, the first conductive layer 3, the second conductive layer 4, the second semiconductor layer 5, the third conductive layer 6, the fourth conductive layer 7 and the fifth conductive layer 8 are sequentially disposed away from the base substrate.

With reference to FIG. 5 and FIG. 6, the display substrate further includes a pixel circuit disposed on the base substrate. The pixel circuit includes a data writing sub-circuit 310, a driving sub-circuit 410, a compensation sub-circuit 510, a first light-emitting control sub-circuit 210, a second light-emitting control sub-circuit 220, a first initialization sub-circuit 110, a second initialization sub-circuit 120 and a third initialization sub-circuit 130. The second initialization sub-circuit 120 includes a first transistor T1. The compensation sub-circuit 510 includes a second transistor T2. The driving sub-circuit 410 includes a third transistor T3. The data writing sub-circuit 310 includes a fourth transistor T4. The first light light-emitting control sub-circuit 210 includes a fifth transistor T5. The second light light-emitting control sub-circuit 220 includes a sixth transistor T6. The first initialization sub-circuit 110 includes a seventh transistor T7. The third initialization sub-circuit 130 includes an eighth transistor T8.

For example, the first semiconductor layer 2 may be formed by semiconductor materials such as low-temperature poly-silicon. A film layer thickness of the first semiconductor layer 2 is in a range of 400 to 800 angstroms, such as 500 angstroms. The second semiconductor layer 5 may be formed by an oxide semiconductor material, such as a poly-silicon oxide semiconductor material such as IGZO. A film layer thickness of the second semiconductor layer 5 is in a range of 300 to 600 angstroms, such as 400 angstroms. The first conductive layer 3, the second conductive layer 4, and the third conductive layer 6 may be formed by a conductive material that forms the gate of the thin film transistor. For example, the conductive material may be Mo, and its film layer thickness may be in a range of 2000 to 3000 angstroms, such as 2500 angstroms. The fourth conductive layer 7 and the fifth conductive layer 8 may be formed by a conductive material forming a source and a drain of the thin film transistor. For example, the conductive material may include Ti, or Al, etc. The fourth conductive layer 7 and the fifth conductive layer 8 may have a stacked structure formed by Ti/Al/Ti, and its film layer thickness may be in a range of 7000 to 9000 angstroms. For example, in a case that the fourth conductive layer 7 and the fifth conductive layer 8 have a stacked structure formed by Ti/Al/Ti, a thickness of each film layer of Ti/Al/Ti may be about 500 angstroms, 5500 angstroms and 500 angstroms, respectively.

In the embodiments of the present disclosure, the first transistor T1, the third transistor T3, the fifth transistor T5, the sixth transistor T6, and the eighth transistor T8 may be formed along the first semiconductor layer 2 as shown in FIG. 9. The second transistor T2, the fourth transistor T4, and the seventh transistor T7 may be formed along the second semiconductor layer 5 as shown in FIG. 13.

As shown in FIG. 9, the first semiconductor layer 2 may have a curved or bended shape and may include a first active layer 20a corresponding to the first transistor T1, a third active layer 20c corresponding to the third transistor T3, a fifth active layer 20e corresponding to the fifth transistor T5, a sixth active layer 20f corresponding to the sixth transistor T6, and an eighth active layer 20h corresponding to the eighth transistor T8.

For example, the first semiconductor layer 2 may include poly-silicon, such as low-temperature poly-silicon materials. The active layer of each transistor may include a channel region, a source region, and a drain region. The channel region may not undergo doping, or the doping type of the channel region is different from the doping type of the source region and the doping type of the drain region, and thus has semiconductor characteristics. The source region and the drain region are located on two sides of the channel region respectively, and are doped with impurities, thus have conductivity. The impurities may vary depending on whether the TFT is an N-type transistor or a P-type transistor.

With reference to FIG. 9 to FIG. 11, the first transistor T1 includes a first active layer 20a and a first gate G1. The first active layer 20a includes a first source region 203a, a first drain region 205a, and a first channel region 201a connecting the first source region 203a and the first drain region 205a. The first source region 203a and the first drain region 205a extend in two opposite directions relative to the first channel region 201a.

The third transistor T3 includes a third active layer 20c and a third gate G3. The third active layer 20c includes a third source region 203c, a third drain region 205c, and a third channel region 201c connecting the third source region 203c and the third drain region 205c. The third source region 203c and the third drain region 205c extend in two opposite directions relative to the third channel region 201c.

The fifth transistor T5 includes a fifth active layer 20e and a fifth gate G5. The fifth active layer 20e includes a fifth source region 203e, a fifth drain region 205e, and a fifth channel region 201e connecting the fifth source region 203e and the fifth drain region 205e. The fifth source region 203e and the fifth drain region 205e extend in two opposite directions relative to the fifth channel region 201e.

The sixth transistor T6 includes a sixth active layer 20f and a sixth gate G6. The sixth active layer 20f includes a sixth source region 203f, a sixth drain region 205f, and a sixth channel region 201f connecting the sixth source region 203f and the sixth drain region 205f. The sixth source region 203f and the sixth drain region 205f extend in two opposite directions relative to the sixth channel region 201f.

The eighth transistor T8 includes an eighth active layer 20h and an eighth gate G8. The eighth active layer 20h includes an eighth source region 203h, an eighth drain region 205h and an eighth channel region 201h connecting the eighth source region 203h and the eighth drain region 205h. The eighth source region 203h and the eighth drain region 205h extend in two opposite directions relative to the eighth channel region 201h.

As shown in FIG. 10 and FIG. 11, the first light-emitting control line EM1, the second light-emitting control line EM2, the second reset signal line GN4, the third reset signal line GN5, and the first conductive portion CG1 are located in the first conductive layer 3. An overlap between the third reset signal line GN5 and the first semiconductor layer 2 forms an eighth gate G8 of the eighth transistor T8. An overlap between the first light-emitting control line EM1 and the first semiconductor layer 2 forms a fifth gate G5 of the fifth transistor T5. An overlap between the first conductive portion CG1 and the first semiconductor layer 2 forms a third gate G3 of the third transistor T3. An overlap between the second light-emitting control line EM2 and the first semiconductor layer 2 forms a sixth gate G6 of the sixth transistor T6. An overlap between the second reset signal line GN4 and the first semiconductor layer 2 forms a first gate G1 of the first transistor T1.

The first conductive portion CG1 also forms an electrode plate of the first capacitor C1, such as a first electrode plate C1a. That is, the first conductive portion CG1 serves as the gate of the third transistor T3 and the electrode plate of the first capacitor C1.

As shown in FIG. 12, a third initialization signal line Vi3, a first sub-line GN21 of a compensation signal line, a first sub-line GN11 of a scanning signal line, a first sub-line GN31 of a first reset signal line, and a second conductive portion CG2 are located in the second conductive layer 4. The second conductive portion CG2 forms another electrode plate of the first capacitor C1, such as a second electrode plate C1b.

As shown in FIG. 13, the second semiconductor layer 5 may have a curved or bended shape and may include a second active layer 20b corresponding to the second transistor T2, a fourth source layer 20d corresponding to the fourth transistor T4, and a seventh active layer 20g corresponding to the seventh transistor T7.

The second active layer 20b includes a second source region 203b, a second drain region 205b, and a second channel region 201b connecting the second source region 203b and the second drain region 205b. The second source region 203b and the second drain region 205b extend in two opposite directions relative to the second channel region 201b.

The fourth source layer 20d includes a fourth source region 203d, a fourth drain region 205d, and a fourth channel region 201d connecting the fourth source region 203d and the fourth drain region 205d. The fourth source region 203d and the fourth drain region 205d extend in two opposite directions relative to the fourth channel region 201d.

The seventh active layer 20g includes a seventh source region 203g, a seventh drain region 205g, and a seventh channel region 201g connecting the seventh source region 203g and the seventh drain region 205g. The seventh source region 203g and the seventh drain region 205g extend in two opposite directions relative to the seventh channel region 201g.

For example, the second semiconductor layer 5 may include oxide semiconductor materials. The active layer of each transistor may include a channel region, a source region, and a drain region. The channel region may not undergo doping, or the doping type of the channel region is different from the doping type of the source region of the channel region and the doping type of the drain region of the channel region, and thus has semiconductor characteristics. The source region and the drain region are located on two sides of the channel region, and are doped with impurities, thus have conductivity. The impurities may vary depending on whether the TFT is an N-type transistor or a P-type transistor.

As shown in FIG. 14, a second initialization signal line Vi2, a first initialization signal line Vi1, a second sub-line GN22 of a compensation signal line, a second sub-line GN12 of a scanning signal line, and a second sub-line GN32 of a first reset signal line are located in the third conductive layer 6.

For example, the first sub-line GN21 of the compensation signal line located in the second conductive layer 4 and the second sub-line GN22 of the compensation signal line located in the third conductive layer 6 may transmit compensation signals. The first sub-line GN11 of the scanning signal line located in the second conductive layer 4 and the second sub-line GN12 of the scanning signal line located in the third conductive layer 6 may transmit scanning signals. The first sub-line GN31 of the first reset signal line located in the second conductive layer 4 and the second sub-line GN32 of the first reset signal line located in the third conductive layer 6 may transmit the first reset signal.

With reference to FIG. 15, an orthographic projection of the line first sub-line GN21 of the compensation signal on the base substrate at least partially overlaps with an orthographic projection of the second semiconductor layer 5 on the base substrate. An orthographic projection of the second sub-line GN22 of the compensation signal line on the base substrate at least partially overlaps with an orthographic projection of the second semiconductor layer on the base substrate. An overlap between the first sub-line GN21 of the compensation signal line and the second semiconductor layer is a first sub control electrode G21 of the second transistor T2. An overlap between the second sub-line GN22 of the compensation signal line and the second semiconductor layer is a second sub control electrode G22 of the second transistor T2.

An orthographic projection of the first sub-line GN11 of the scanning signal line on the base substrate at least partially overlaps with an orthographic projection of the second semiconductor layer 5 on the base substrate. An orthographic projection of the second sub-line GN12 of the scanning signal line on the base substrate at least partially overlaps with an orthographic projection of the second semiconductor layer on the base substrate. An overlap between the first sub-line GN11 of the scanning signal line and the second semiconductor layer 5 is a first sub control electrode G41 of the fourth transistor T4. An overlap between the second sub-line GN12 of the scanning signal line and the second semiconductor layer 5 is a second sub control electrode G42 of the fourth transistor T4.

An orthographic projection of the first sub-line GN31 of the first reset signal line on the base substrate at least partially overlaps with an orthographic projection of the second semiconductor layer 5 on the base substrate. An orthographic projection of the second sub-line GN32 of the first reset signal line on the base substrate at least partially overlaps with an orthographic projection of the second semiconductor layer 5 on the base substrate. An overlap between the first sub-line GN31 of the first reset signal line and the second semiconductor layer 5 is a first sub control electrode G71 of the seventh transistor T7. An overlap between the second sub-line GN32 of the first reset signal line and the second semiconductor layer 5 is a second sub control electrode G72 of the seventh transistor T7.

For example, the second transistor T2, the fourth transistor T4, and the seventh transistor T7 have dual gate structures. In the embodiments of the present disclosure, the second transistor T2, the fourth transistor T4, and the seventh transistor T7 are disposed as oxide semiconductor transistors, and the second transistor T2, the fourth transistor T4, and the seventh transistor T7 have dual gate structures, which is beneficial for reducing the leakage current of the first node N1 and the fourth node N4, thereby being beneficial for the potential stability of the first node N1 and the fourth node N4.

FIG. 16 is a schematic diagram of a planar structure of a combination of a first semiconductor layer, a first conductive layer, a second conductive layer, a second semiconductor layer, and a third conductive layer of a pixel circuit according to an exemplary embodiment of the present disclosure, in which the first gate G1 of the first transistor, the first sub control electrode G21 and the second sub control electrode G22 of the second transistor, and the third gate G3 of the third transistor, the first sub control electrode G41 and the second sub control electrode G42 of the fourth transistor, the fifth gate G5 of the fifth transistor, the sixth gate G6 of the sixth transistor, the first sub control electrode G71 and the second sub control electrode G72 of the seventh transistor, the eighth gate G8 of the eighth transistor, and the first capacitor C1 are shown. FIG. 17 is a schematic diagram of a via hole in an insulation layer formed on the structure of FIG. 16, in which a first via hole VH1 is shown.

As shown in FIG. 18, the display substrate further includes a fourth conductive layer 7 and a plurality of connecting signal lines 76 located in the fourth conductive layer 7. The plurality of connecting signal lines 76 extend along a second direction Y, respectively. The fourth conductive layer 7 further includes a third conductive portion CG3. With reference to FIG. 16 and FIG. 7, the third conductive portion CG3 may be electrically connected to the second conductive portion CG2 through the first via hole VH1. The fourth conductive portion 7 further includes a first initialization signal line transfer portion 71, a second initialization signal line transfer portion 72, a third initialization signal line transfer portion 73, a first power supply line transfer portion 74 and a data signal line transfer portion 75.

FIG. 19 is a schematic diagram of a via hole in an insulation layer formed on the structure of FIG. 18, in which a second via hole VH2, a first node N1, a third node N3, and a fourth node N4 are shown.

FIG. 20 is a schematic diagram of a planar structure of a fifth conductive layer of a pixel circuit according to an exemplary embodiment of the present disclosure, in which a data signal line Vdata and a first voltage signal line VDD are shown, and the first voltage signal line includes a widened portion VDDL.

FIG. 21 is a schematic diagram of a planar structure of a combination of a first semiconductor layer, a first conductive layer, a second conductive layer, a second semiconductor layer, a third conductive layer, a fourth conductive layer and a fifth conductive layer of a pixel circuit according to an exemplary embodiment of the present disclosure.

With reference to FIG. 9 to FIG. 21, the pixel circuit includes a first transistor T1, a second transistor T2, a third transistor T3, a fourth transistor T4, a fifth transistor T5, a sixth transistor T6, a seventh transistor T7, an eighth transistor T8, a first capacitor C1, and a second capacitor C2. The gate of the third transistor T3, the first electrode of the second transistor T2, and an electrode plate of the first capacitor C1 are coupled at the first node N1. The second electrode of the second transistor T2, the second electrode of the third transistor T3, the first electrode of the sixth transistor T6, and the first electrode of the eighth transistor T8 are coupled at the third node N3. The first electrode of the fourth transistor T4, the first electrode of the seventh transistor T7, the second electrode plate of the first capacitor C1, and the first electrode plate of the second capacitor C2 are coupled at the fourth node N4. The second electrode of the first transistor T1 is electrically connected to the second initialization signal line Vi2 through the second initialization signal line transfer portion 72. The second electrode of the fourth transistor T4 is electrically connected to the data signal line Vdata through the data signal line transfer portion 75. The first electrode of the fifth transistor T5 is electrically connected to the first power supply line VDD through the first power supply line transfer portion 74. The second electrode of the seventh transistor T7 is electrically connected to the first initialization signal line Vi1 through the first initialization signal line transfer portion 71. The second electrode of the eighth transistor T8 is electrically connected to the third initialization signal line Vi3 through the third initialization signal line transfer portion 73.

The conductive layers located in different film layers may be electrically connected through via holes. For example, the data signal line Vdata is electrically connected to the data signal line transfer portion 75 through the second via hole VH2, and then the data signal is written into the pixel circuit through the fourth transistor T4.

With reference to FIG. 12, FIG. 14 and FIG. 21, the first initialization signal line Vi1 and the second initialization signal line Vi2 are located in the third conductive layer 6. The third initialization signal line Vi3 is located in the second conductive layer 4. At least one of the first initialization signal line Vi1, the second initialization signal line Vi2, and the third initialization signal line Vi3 extends along the first direction X. At least one of the first initialization signal line Vi1, the second initialization signal line Vi2, and the third initialization signal line Vi3 is electrically connected to the plurality of connecting signal lines 76, so as to form a mesh structure. By designing a mesh structure, any two of the first initialization signal line Vi1, the second initialization signal line Vi2, and the third initialization signal line Vi3 may be electrically connected to each other, thereby saving wiring space and improving the pixel opening rate.

With reference to FIG. 5 and FIG. 6, the pixel circuit further includes a storage sub-circuit 610 and a potential maintaining sub-circuit 620. The storage sub-circuit 610 includes a first capacitor C1. The potential maintaining sub-circuit 620 includes a second capacitor C2. With reference to FIG. 10, FIG. 12, FIG. 18, FIG. 20 and FIG. 21, the display substrate further includes a first conductive portion CG1 located in the first conductive layer 3, a second conductive portion CG2 located in the second conductive layer 4, a third conductive portion CG3 located in the fourth conductive layer 7, and a first voltage signal line VDD located in the fifth conductive layer. The first voltage signal line includes a widened portion VDDL. The first conductive portion CG1 is a first terminal of the first capacitor C1. The second conductive portion CG2 and the third conductive portion CG3 electrically connected to each other are a second terminal of the first capacitor C1 and a second terminal of the second capacitor C2. The widened portion VDDL of the first voltage signal line is a first terminal of the second capacitor C2. An orthographic projection of the widened portion VDDL of the first voltage signal line on the base substrate covers an orthographic projection of each of the first conductive portion CG1, the second conductive portion CG2 and the third conductive portion CG3 on the base substrate.

For example, the widened portion VDDL of the first power supply signal line may fully cover the first capacitor C1 and the second capacitor C2, which meets the requirements of shielding capacitors.

With reference to FIG. 1, at least some embodiments of the present disclosure further provide a display device. The display device may include the display substrate as described above.

The display device may include any device or product with display functions. For example, the display device may be a smartphone, a mobile phone, an e-book reader, a desktop computer (PC), a laptop PC, a netbook PC, a personal digital assistant (PDA), a portable multimedia player (PMP), a digital audio player, a mobile medical device, a camera, a wearable device (such as head-worn device, electronic clothing, electronic bracelet, electronic necklace, electronic accessory, electronic tattoo, or smart watch), or a television, etc.

It should be understood that the display panel and the display device according to the embodiments of the present disclosure have all the characteristics and advantages of the display substrate mentioned above, which may be described in detail above and will not be repeated herein. Although some embodiments of the entire technical concept of the present disclosure have been shown and explained, those of ordinary skilled in the art will understand that changes may be made to these embodiments without departing from the principles and spirit of the entire technical concept. The scope of the present disclosure is limited by the claims and their equivalents.

What is claimed is:
1. A pixel circuit, comprising:
   a data writing sub-circuit coupled to a data signal terminal, a scanning sig nal terminal and a fourth node, and configured to write a data signal received at the data signal terminal into the fourth node, in response to a scanning signal received at the scanning signal terminal;

a first light-emitting control sub-circuit coupled to a first voltage terminal, a first light-emitting control terminal and a second node, and configured to write a first voltage received at the first voltage terminal into the second node, in response to a first light-emitting control signal received at the first light-emitting control terminal;

a driving sub-circuit coupled to a first node, the second node and a third node, and configured to generate a driving current in response to a voltage of the first node;

a storage sub-circuit coupled between the first node and the fourth node, and configured to store a voltage;

a compensation sub-circuit coupled to a compensation signal terminal, the first node and the third node, and configured to transmit the first voltage from the first voltage terminal and a threshold voltage of the driving sub-circuit to the first node, in response to a compensation control signal received at the compensation signal terminal;

a second light-emitting control sub-circuit coupled to the third node, a second light-emitting control terminal and a first electrode of a light-emitting element, and configured to output the driving current transmitted to the third node to the light-emitting element, in response to a second light-emitting control signal received at the second light-emitting control terminal;

a first initialization sub-circuit coupled to a first reset signal terminal, a first initialization signal terminal and the fourth node, and configured to transmit a first initialization signal received at the first initialization signal terminal to the fourth node, in response to a first reset signal received at the first reset signal terminal, so as to initialize a potential of the fourth node;

a second initialization sub-circuit coupled to a second reset signal terminal, a second initialization signal terminal and the first electrode of the light-emitting element, and configured to transmit a second initialization signal received at the second initialization signal terminal to the first electrode of the light-emitting element, in response to a second reset signal received at the second reset signal terminal, so as to initialize a potential of the first electrode of the light-emitting element; and a third initialization sub-circuit coupled to a third reset signal terminal, a third initialization signal terminal and the third node, and configured to transmit a third initialization signal received at the third initialization signal terminal to the third node, in response to a third reset signal received at the third reset signal terminal, so as to initialize a potential of the third node.

2. The pixel circuit of claim 1, wherein the pixel circuit further comprises:

a potential maintaining sub-circuit coupled between the first voltage terminal and the fourth node, and configured to maintain a potential of the first node.

3. The pixel circuit of claim 1, wherein the pixel circuit is configured to transmit the first voltage from the first voltage terminal and the threshold voltage of the driving sub-circuit to the first node, in response to the first light-emitting control signal, the first reset signal and the compensation control signal.

4. The pixel circuit of claim 1, wherein the third initialization sub-circuit and the compensation sub-circuit are further configured to transmit the third initialization signal received at the third initialization signal terminal to the first node, in response to the third reset signal received at the third reset signal terminal and in response to a second control signal received at the compensation signal terminal, so as to initialize a potential of the first node.

5. The pixel circuit of claim 1, wherein the second initialization sub-circuit comprises a first transistor, wherein a control electrode of the first transistor is coupled to the second reset signal terminal, a first electrode of the first transistor is coupled to the second initialization signal terminal, and a second electrode of the first transistor is coupled to the first electrode of the light-emitting element.

6. The pixel circuit of claim 5, wherein the compensation sub-circuit comprises a second transistor, wherein a control electrode of the second transistor is coupled to the compensation signal terminal, a first electrode of the second transistor is coupled to the first node, and a second electrode of the second transistor is coupled to the third node.

7. The pixel circuit of claim 5, wherein the driving sub-circuit comprises a third transistor, wherein a control electrode of the third transistor is coupled to the first node, a first electrode of the third transistor is coupled to the second node, and a second electrode of the third transistor is coupled to the third node.

8. The pixel circuit of claim 5, wherein the data writing sub-circuit comprises a fourth transistor, wherein a control electrode of the fourth transistor is coupled to the scanning signal terminal, a first electrode of the fourth transistor is coupled to the data signal terminal, and a second electrode of the fourth transistor is coupled to the fourth node.

9. The pixel circuit of claim 5, wherein the first light-emitting control sub-circuit comprises a fifth transistor, wherein a control electrode of the fifth transistor is coupled to the first light-emitting control terminal, a first electrode of the fifth transistor is coupled to the first voltage terminal, and a second electrode of the fifth transistor is coupled to the second node.

10. The pixel circuit of claim 5, wherein the second light-emitting control sub-circuit comprises a sixth transistor, wherein a control electrode of the sixth transistor is coupled to the second light-emitting control terminal, a first electrode of the sixth transistor is coupled to the third node, and a second electrode of the sixth transistor is coupled to the first electrode of the light-emitting element.

11. The pixel circuit of claim 5, wherein the first initialization sub-circuit comprises a seventh transistor, wherein a control electrode of the seventh transistor is coupled to the first reset signal terminal, a first electrode of the seventh transistor is coupled to the first initialization signal terminal, and a second electrode of the seventh transistor is coupled to the fourth node.

12. The pixel circuit of claim 5, wherein the third initialization sub-circuit comprises an eighth transistor, wherein a control electrode of the eighth transistor is coupled to the third reset signal terminal, a first electrode of the eighth transistor is coupled to the third initialization signal terminal, and a second electrode of the eighth transistor is coupled to the third node.

13. The pixel circuit of claim 5, wherein the storage sub-circuit comprises a first capacitor, wherein a first terminal of the first capacitor is coupled to the first node, and a second terminal of the first capacitor is coupled to the fourth node.

14. The pixel circuit of claim 5, wherein the potential maintaining sub-circuit comprises a second capacitor, wherein a first terminal of the second capacitor is coupled to the first voltage terminal, and a second terminal of the second capacitor is coupled to the fourth node, wherein the second reset signal terminal and the third reset signal terminal are a same reset signal terminal.

15. A method for driving a pixel circuit applied to a pixel circuit of claim 1, wherein the driving method comprises:
in a compensation stage of an image frame, in which the first light-emitting control sub-circuit writes a first voltage received at the first voltage terminal into the second node, in response to the first light-emitting control signal; and conducting the first initialization sub-circuit and the compensation sub-circuit, in response to the first reset signal and the compensation control signal, so that the first voltage from the first voltage terminal and a threshold voltage of the driving sub-circuit are transmitted to the first node,
wherein a time of the compensation stage is adjusted by the first light-emitting control signal, the first reset signal, and the compensation control signal.

16. The method of claim 15, further comprising:
in a reset stage of an image frame, in which the first initialization sub-circuit transmits a first initialization signal received at the first initialization signal terminal to the fourth node, in response to the first reset signal received at the first reset signal terminal, so as to initialize a potential of the fourth node; and after a preset time interval, in which the third initialization sub-circuit transmits a third initialization signal received at the third initialization signal terminal to the third node, in response to a third reset signal received at the third reset signal terminal, and conducting the compensation sub-circuit, in response to the compensation control signal received at the compensation signal terminal, so that the third initialization signal is transmitted to the first node to initialize a potential of the first node.

17. A display substrate, comprising:
a base substrate;
a pixel circuit of claim 1 disposed on the base substrate; and
a light-emitting element disposed on the base substrate, wherein the light-emitting element is coupled to the pixel circuit.

18. A display device comprising a display substrate of claim 17.

19. A display substrate, comprising:
a base substrate;
a first semiconductor layer disposed on the base substrate;
a first conductive layer disposed on a side of the first semiconductor layer away from the base substrate;
a second conductive layer disposed on a side of the first conductive layer away from the base substrate;
a second semiconductor layer disposed on a side of the second conductive layer away from the base substrate, wherein the second semiconductor layer comprises an oxide semiconductor;
a third conductive layer disposed on a side of the second semiconductor layer away from the base substrate;
a fourth conductive layer disposed on a side of the third conductive layer away from the base substrate; and
a fifth conductive layer disposed on a side of the fourth conductive layer away from the base substrate,
wherein the display substrate further comprises a pixel circuit disposed on the base substrate, the pixel circuit comprises a data writing sub-circuit, a driving sub-circuit, a compensation sub-circuit, a first light-emitting control sub-circuit, a second light-emitting control sub-circuit, a first initialization sub-circuit, a second initialization sub-circuit and a third initialization sub-circuit, the second initialization sub-circuit comprises a first transistor, the compensation sub-circuit comprises a second transistor, the driving sub-circuit comprises a third transistor, the data writing sub-circuit comprises a fourth transistor, the first light-emitting control sub-circuit comprises a fifth transistor, the second light-emitting control sub-circuit comprises a sixth transistor, the first initialization sub-circuit comprises a seventh transistor, and the third initialization sub-circuit comprises an eighth transistor;
the display substrate further comprises: a second reset signal line, a first light-emitting control line and a second light-emitting control line which are located in the first conductive layer; a third initialization signal line, a first sub-line of a compensation signal line, a first sub-line of a first reset signal line and a first sub-line of a scanning signal line which are located in the second conductive layer; a second initialization signal line, a first initialization signal line, a second sub-line of the compensation signal line, a second sub-line of the first reset signal line and a second sub-line of the scanning signal line which are located in the third conductive layer;
an orthographic projection of the first sub-line of the compensation signal line on the base substrate at least partially overlaps with an orthographic projection of the second semiconductor layer on the base substrate, an orthographic projection of the second sub-line of the compensation signal line on the base substrate at least partially overlaps with an orthographic projection of the second semiconductor layer on the base substrate, an overlap between the first sub-line of the compensation signal line and the second semiconductor layer is a first sub control electrode of the second transistor, and an overlap between the second sub-line of the compensation signal line and the second semiconductor layer is a second sub control electrode of the second transistor;
an orthographic projection of the first sub-line of the scanning signal line on the base substrate at least partially overlaps with an orthographic projection of the second semiconductor layer on the base substrate, an orthographic projection of the second sub-line of the scanning signal line on the base substrate at least partially overlaps with an orthographic projection of the second semiconductor layer on the base substrate, an overlap between the first sub-line of the scanning signal line and the second semiconductor layer is a first sub control electrode of the fourth transistor, and an overlap between the second sub-line of the scanning signal line and the second semiconductor layer is a second sub control electrode of the fourth transistor; and
an orthographic projection of the first sub-line of the first reset signal line on the base substrate at least partially overlaps with an orthographic projection of the second semiconductor layer on the base substrate, an orthographic projection of the second sub-line of the first reset signal line on the base substrate at least partially overlaps with an orthographic projection of the second semiconductor layer on the base substrate, an overlap between the first sub-line of the first reset signal line and the second semiconductor layer is a first sub control electrode of the seventh transistor, and an overlap between the second sub-line of the first reset signal line and the second semiconductor layer is a second sub control electrode of the seventh transistor.

20. The display substrate of claim 19, wherein the display substrate further comprises a plurality of connecting signal lines located in the fourth conductive layer;

at least one of the first initialization signal line, the second initialization signal line and the third initialization signal line extends along a first direction, the plurality of connecting signal lines extend along a second direction, respectively, and at least one of the first initialization signal line, the second initialization signal line and the third initialization signal line is electrically connected to the plurality of connecting signal lines to form a mesh structure, wherein the pixel circuit further comprises a storage sub-circuit and a potential maintaining sub-circuit, the storage sub-circuit comprises a first capacitor, and the potential maintaining sub-circuit comprises a second capacitor;

the display substrate further comprises a first conductive portion located in the first conductive layer, a second conductive portion located in the second conductive layer, a third conductive portion located in the fourth conductive layer, and a first voltage signal line located in the fifth conductive layer, wherein the first voltage signal line comprises a widened portion;

the first conductive portion is a first terminal of the first capacitor, the second conductive portion and the third conductive portion electrically connected to each other are a second terminal of the first capacitor and a second terminal of the second capacitor, and the widened portion of the first voltage signal line is a first terminal of the second capacitor; and an orthographic projection of the widened portion of the first voltage signal line on the base substrate covers an orthographic projection of each of the first conductive portion, the second conductive portion and the third conductive portion on the base substrate.

* * * * *